US007462441B2

(12) United States Patent
Ezure

(10) Patent No.: US 7,462,441 B2
(45) Date of Patent: Dec. 9, 2008

(54) PLANOGRAPHIC PRINTING PLATE MATERIAL AND PRINTING METHOD

(75) Inventor: Hidetoshi Ezure, Musashino (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 18 days.

(21) Appl. No.: 11/358,167

(22) Filed: Feb. 21, 2006

(65) Prior Publication Data

US 2006/0188815 A1 Aug. 24, 2006

(30) Foreign Application Priority Data

Feb. 22, 2005 (JP) ............................ 2005-045841
Jan. 5, 2006 (JP) ............................ 2006-000477

(51) Int. Cl.
*G03F 7/00* (2006.01)
*G03F 7/004* (2006.01)

(52) U.S. Cl. ................ 430/302; 430/270.1; 430/271.1; 430/434; 430/435; 430/494; 430/944; 430/945

(58) Field of Classification Search .............. 430/270.1, 430/271.1, 302, 434, 435, 494, 944, 945
See application file for complete search history.

(56) References Cited

U.S. PATENT DOCUMENTS 6,399,270 B1 * 6/2002 Mori et al. ............... 430/270.1
6,596,462 B2 * 7/2003 Mori ....................... 430/272.1
2004/0206261 A1 * 10/2004 Hiraoka ...................... 101/453
2005/0058942 A1 * 3/2005 Maehashi ................... 430/300
2005/0181308 A1 * 8/2005 Mori .......................... 430/302
2006/0019196 A1 * 1/2006 Miyoshi ................. 430/270.1

FOREIGN PATENT DOCUMENTS

| | | | |
|---|---|---|---|
| JP | 05-066564 | A | 3/1993 |
| JP | 06-186750 | A | 7/1994 |
| JP | 06-199064 | A | 7/1994 |
| JP | 07-314934 | A | 12/1995 |
| JP | 09-123387 | A | 5/1997 |
| JP | 09-123388 | A | 5/1997 |
| JP | 10-058636 | A | 3/1998 |
| JP | 10-244773 | A | 9/1998 |
| JP | 11-240270 | A | 9/1999 |
| JP | 2000-238451 | A | 9/2000 |
| JP | 2001-096710 | A | 4/2001 |

* cited by examiner

*Primary Examiner*—Amanda C. Walke
(74) *Attorney, Agent, or Firm*—Frishauf, Holtz, Goodman & Chick, P.C.

(57) ABSTRACT

An object of the present invention is to provide a planographic printing plate material as well as a printing method in which excellent properties of on-press development, exposure image visualization, scratch resistance, background contamination resistance, and printing durability are exhibited. Disclosed is a planographic printing plate material possessing a hydrophilic layer and an image formation layer provided on a plastic support, wherein the image formation layer contains polyolefin wax having a melting point of 105-120° C. and a melt viscosity of 1-1200 mPa·s, the hydrophilic layer contains spherical silica particles having a particle diameter of 5.0-7.0 μm, and a content ratio of the spherical silica particles having a particle diameter of 5.0-7.0 μm is not less than 60% by volume, based on a total volume of particles having a particle diameter of 2-10 μm contained in the hydrophilic layer.

8 Claims, No Drawings

PLANOGRAPHIC PRINTING PLATE MATERIAL AND PRINTING METHOD

This application claims priority from Japanese Patent Application Nos. 2005-045841 (filed on Feb. 22, 2005) and 2006-000477 (filed on Jan. 5, 2006), which are incorporated hereinto by reference.

TECHNICAL FIELD

The present invention relates to a planographic printing plate material (hereinafter, also referred to as a printing plate material) including plastic provided as a support, and a printing method employing the planographic printing plate material.

BACKGROUND

In recent years, a computer to plate system (CTP), in which image data can be directly recorded in a printing plate material, has been widely used in conjunction with the digitization of printing data. As a usable printing plate material for CTP, there are a printing plate material comprising an aluminum support such as a conventional PS plate, and a flexible printing plate material comprising a flexible resin film sheet and provided thereon, various functional layers.

Recently, in the commercial printing industry, there is a tendency that many kinds of prints are printed in small quantities, and an inexpensive printing plate material with high quality has been required in the market. As a conventional flexible printing plate material, there are a silver salt diffusion transfer type printing plate material as disclosed in Japanese Patent O.P.I. Publication No. 5-66564, in which a silver salt diffusion transfer type light sensitive layer is provided on a flexible sheet; an ablation type printing plate material as disclosed in Japanese Patent O.P.I. Publication Nos. 8-507727, 6-186750, 6-199064, 7-314934, 10-58636 and 10-244773 in which a hydrophilic layer and a lipophilic layer, one of which is an outermost layer, are provided on a flexible sheet where the outermost layer is ablated by laser exposure to prepare a printing plate; and a heat melt type printing plate material as disclosed in Japanese Patent O.P.I. Publication No. 2001-96710 in which a hydrophilic layer and a heat melt image formation layer are provided on a flexible sheet where a hydrophilic layer or a heat melt image formation layer is imagewise heated by laser exposure to heat and fix the image formation layer onto the hydrophilic layer.

On the other hand, in view of environmental consideration and so forth, a printing plate after writing image data (imagewise exposure) is mounted directly on an off-set press. Commonly known is a so-called on-press developing method in which, when on printing, dampening water is supplied to the printing plate material, whereby only the image formation layer at non-image portions is swollen or dissolved by the dampening water, and transferred to a printing paper (paper waste) at an initial stage of printing to remove (refer to Patent Documents 1 and 2). By providing the printing plate material capable of on-press printing, not only fresh dot shape and high quality images are obtained, but also a simple process in which a developing process is unnecessary to be used, and excellent environment suitability is attained.

However, the above printing plate material has problems in that initial ink receptivity and printing durability are degraded, since a hydrophilic layer and an image formation layer are weak in layer strength. A trial to solve the objective is made by adding a water-soluble resin or a thermoplastic resin into the hydrophilic layer and into the image formation layer (refer to Patent Document 3), but in the case of printing employing powders, the problem has not yet been solved, and development of a printing plate to improve the above objective has been strongly desired.

As to a thermal processless printing plate material, image visualization after image recording (hereinafter also referred to as exposure image visualization) is provided as one of the important desired characteristics. As a method for providing exposure image visualization, a method (refer to Patent Document 4, for example) is cited which employs a color fading property due to exposure of an infrared absorbing dye. However, when such a dye is added into an image formation layer, color difference between exposed portions and unexposed portions is increased to improve exposure image visualization, i.e. to increase an optical density at unexposed portions, resulting in problematic contamination of a printing press during on-press developing at unexposed portions, and it has been difficult for prior art to give sufficient printing durability and excellent exposure image visualization to the processless printing plate.

(Patent Document 1) Japanese Patent O.P.I. Publication No. 9-123387

(Patent Document 2) Japanese Patent O.P.I. Publication No. 9-123388

(Patent Document 3) Japanese Patent O.P.I. Publication No. 2000-238451

(Patent Document 4) Japanese Patent O.P.I. Publication No. 11-240270

SUMMARY

The present invention has been carried out to solve the above problem, and it is an object of the present invention to provide a planographic printing plate material as well as a printing method in which excellent properties of on-press development, exposure image visualization, scratch resistance, background contamination resistance, and printing durability are exhibited. Disclosed is a planographic printing plate material possessing a hydrophilic layer and an image formation layer provided on a plastic support, wherein the image formation layer contains polyolefin wax having a melting point of 105-120° C. and a melt viscosity of 1-1200 mPa·s, the hydrophilic layer contains spherical silica particles having a particle diameter of 5.0-7.0 μm, and a content ratio of the spherical silica particles having a particle diameter of 5.0-7.0 μm is not less than 60% by volume, based on a total volume of particles having a particle diameter of 2-10 μm contained in the hydrophilic layer.

BRIEF DESCRIPTION OF THE PREFERRED EMBODIMENTS

The above object of the present invention is accomplished by the following structures.

(Structure 1) A planographic printing plate material possessing a hydrophilic layer and an image formation layer provided on a plastic support, wherein the image formation layer contains polyolefin wax having a melting point of 105-120° C. and a melt viscosity of 1-1200 mPa·s, the hydrophilic layer contains spherical silica particles having a particle diameter of 5.0-7.0 μm, and the content ratio of the spherical silica particles having a particle diameter of 5.0-7.0 μm is not less than 60% by volume, based on a total volume of particles having a particle diameter of 2-10 μm contained in the hydrophilic layer.

(Structure 2). The planographic printing plate material of Structure 1, wherein a CV value in a particle diameter distribution of spherical silica particles having a particle diameter of 5.0-7.0 μm is 10% or less.

(Structure 3) The planographic printing plate material of Structure 1 or 2, wherein the hydrophilic layer is composed of an upper hydrophilic layer and a lower hydrophilic layer, and the lower hydrophilic layer contains spherical silica particles having a particle diameter of 5.0-7.0 μm.

(Structure 4) The planographic printing plate material of Structure 3, wherein the lower hydrophilic layer further contains spherical silica particles having a particle diameter of 3.0-4.0 μm.

(Structure 5) The planographic printing plate material of any one of Structures 1-4, wherein a number average molecular weight of the polyolefin wax is 500-5000.

(Structure 6) The planographic printing plate material of any one of Structures 1-5, wherein the hydrophilic layer contains a light-to-heat conversion material.

(Structure 7) The planographic printing plate material of any one of Structures 1-6, wherein the image formation layer is an on-press developable layer.

(Structure 8) The planographic printing plate material of any one of Structures 1-7, wherein the planographic printing plate material is in the form of a roll.

(Structure 9) A printing method, wherein a developing process by supplying dampening water or dampening water and printing ink on a planographic printing press, and printing are conducted after forming images on the planographic printing plate material of any one of Structures 1-8, employing a thermal head or an infrared laser.

While the preferred embodiments of the present invention have been described using specific terms, such description is for illustrative purposes only, and it is to be understood that changes and variations may be made without departing from the spirit or scope of the appended claims.

DETAILED DESCRIPTION OF THE INVENTION

The preferred embodiments of the present invention will be explained below, but the present invention is not limited thereto.

The present invention discloses a feature of a planographic printing plate material comprising a hydrophilic layer and an image formation layer provided on a plastic support, wherein the image formation layer contains polyolefin wax having a melting point of 105-120° C. and a melt viscosity of 1-1200 mPa·s, the hydrophilic layer contains spherical silica particles having a particle diameter of 5.0-7.0 μm, and the content ratio of the spherical silica particles having a particle diameter of 5.0-7.0 μm is not less than 60% by volume, based on a total volume of particles having a particle diameter of 2-10 μm contained in the hydrophilic layer.

The image formation layer of the present invention contains polyolefin wax having a melting point of 105-120° C. and a melt viscosity of 1-1200 mPa·s.

The image formation layer contains heat melting particles made of wax or such, and heat fusible particles made of latex or such as major components as described below, and also contains polyolefin wax exhibiting a high particle hardness property, whereby the film strength of the image formation layer can be improved.

Since polyolefin wax is a polymer-based wax, and is capable of producing a large change in refractive indices before and after light exposure, the exposure image visualization can be improved by increasing the color difference between exposed portions and unexposed portions. In the case of employing on-press development as well as powder, printing durability and image visualization can be improved at the same time via the above effect. Excellent properties of on-press development, exposure image visualization, scratch resistance and printing durability are obtained particularly by containing the above-mentioned specific particles in the hydrophilic layer.

(Polyolefin Wax)

Polyolefin wax of the present invention means polyolefin with a low molecular weight, having a molecular weight of not more than 5000.

Polypropylene, polyethylene and ethylene-propylene copolymer are provided as polyolefin wax employed in the present invention. Of these, polyethylene wax is preferably used because of easy fusibility at the time of light exposure, and particle hardness to increase film strength. Acid modified or oxidized wax is also allowed to be used as wax, but plain wax is preferable.

It is desired in view of printing durability that the polyolefin wax of the present invention has a melting point of 105-120° C. and a melt viscosity of 1-1200 mPa·s.

Melt viscosity means a value measured by a rotational viscosimeter according to DIN51562.

The image formation layer may contain wax other than polyethylene wax of the present invention. It is preferable to increase the color difference between exposed portions and unexposed portions, since diffused reflectiveness at unexposed portions is maintained when wax other than polyolefin wax is contained in the image formation layer.

Polyolefin wax used in the present invention is preferably used as a water dispersant (emulsion) prepared by employing a dispersant. A method of dispersing polyolefin wax is not particularly limited, if the method is industrially viable. There is also a manufacturing method via polymerization of polyolefin as a manufacturing method of olyolefin wax. In this case, provided are two methods such as a method of polymerization at high-temperature and pressure via radical polymerization and a method of polymerization at low pressure employing a Ziegler catalyst. There are also other methods such as a method of lowering a molecular weight by thermally decomposing a regular mold polyolefin, a method of separating and refining polyolefin having a low molecular weight as a by-product produced when a regular molding polyolefin is prepared, a method of oxidizing a regular molding polyolefin, and the like.

It is preferable in view of printing durability as well as via exposure image visualization that the average particle diameter at the time of emulsion is 0.05-2.0 μm, more preferably 0.1-1.0 μm, and still more preferably 0.4-0.8 μm.

The number average molecular weight of polyolefin is preferably 500-5000, and more preferably 800-2000 in view of printing durability.

The content of polyolefin with respect to the image formation layer is preferably 3-80% by weight, and more preferably 5-50% by weight.

(Image Formation Layer)

An image formation layer in the present invention may contain heat melting particles and/or heat fusible particles other than polyolefin as described below, or other materials.

Even though polyolefin wax is solely used, the color difference between exposed portions and unexposed portions can be increased with a change in the diffractive index of the wax, but It is preferable to increase the color difference between exposed portions and unexposed portions, since diffused reflectiveness at unexposed portions is maintained by mixing heat melting particles made of wax other than polyolefin wax and heat fusible particles made of latex. In order to add film strength as well as melting capability, these particles can be added to the extent that the effects of the present invention are not lost.

It is preferable that these heat melting particles are those composed of materials exhibiting low-viscosity in the molten state among thermoplastic materials, which are generally categorized as wax. The materials preferably have a softening point of 40-120° C. and a melting point of 60-150° C., or more preferably a softening point of 40-100° C. and a melting point of 60-120° C.

Usable Materials include carnauba, paraffin, microcrystalline wax, and fatty acid wax. The molecular weight thereof is approximately from 800 to 10,000. A polar group such as a hydroxyl group, an ester group, a carboxyl group, an aldehyde group and a peroxide group may be introduced into the wax by oxidation to increase the emulsification ability. Moreover, stearoamide, linolenamide, laurylamide, myristylamide, hardened cattle fatty acid amide, parmitylamide, oleylamide, rice bran oil fatty acid amide, palm oil fatty acid amide, a methylol compound of the above-mentioned amide compounds, methylenebissteastearoamide and ethylenebissteastearoamide may be added to the wax to lower the softening point or to raise the working efficiency. A cumarone-indene resin, a rosin-modified phenol resin, a terpene-modified phenol resin, a xylene resin, a ketone resin, an acryl resin, an ionomer and a copolymer of these resins may also be viable.

Among the above, carnauba, microcrystalline wax, fatty acid ester, fatty acid amide or fatty acid is preferably contained. Highly sensitive image formation can thereby be performed since carnauba specifically has a relative low melting point as well as a low melt viscosity, and also possesses a lubrication capability. Accordingly, even when a shearing force is applied to the surface layer of the printing plate precursor, the layer damage is minimized, and resistance to contamination which may be caused by scratches, is further enhanced.

The heat melting particles are preferably dispersible in water. The average particle size thereof is preferably 0.01-10 μm, and more preferably 0.1-3 μm.

The composition of heat melting particles may continuously vary from the interior to the surface of the particles, and the particles may be covered with a different material. A commonly known microcapsule production method or a sol-gel method can be applied for covering the particles.

The content of heat melting particles in the image formation layer is preferably 1-90% by weight, and more preferably 5-80% by weight, based on the total layer weight.

Heat fusible particles include thermoplastic hydrophobic polymer particles. Although there is no specific limitation to the upper limit of the softening point of the thermoplastic hydrophobic polymer particles, the softening point is preferably lower than the decomposition temperature of the polymer particles. The weight average molecular weight (Mw) of the polymer is preferably within the range of 10,000-1,000,000.

Specific examples of the polymer consistituting the polymer particles include a diene (co)polymer such as polypropylene, polybutadiene, polyisoprene or an ethylene-butadiene copolymer; a synthetic rubber such as a styrene-butadiene copolymer, a methyl methacrylate-butadiene copolymer or an acrylonitrile-butadiene copolymer; a (meth)acrylate (co) polymer or a (meth)acrylic acid (co)polymer such as polymethyl methacrylate, a methyl methacrylate-(2-ethylhexyl) acrylate copolymer, a methyl methacrylate-methacrylic acid copolymer, or a methyl acrylate-(N-methylolacrylamide); polyacrylonitrile; a vinyl ester (co)polymer such as a polyvinyl acetate, a vinyl acetate-vinyl propionate copolymer and a vinyl acetate-ethylene copolymer, or a vinyl acetate-2-hexylethyl acrylate copolymer; and polyvinyl chloride, polyvinylidene chloride, polystyrene and a copolymer thereof. Of these, the (meth)acrylate polymer, the (meth)acrylic acid (co) polymer, the vinyl ester (co)polymer, the polystyrene and the synthetic rubbers are preferable.

These polymer particles may be made of a polymer synthesized by any of the commonly known methods such as an emulsion polymerization method, a suspension polymerization method, a solution polymerization method and a gas phase polymerization method. The particles of the polymer synthesized by the solution polymerization method or the gas phase polymerization method can be produced via a method in which an organic solution of the polymer is sprayed into an inactive gas and dried, and a method in which the polymer is dissolved in a water-immiscible solvent, then the resulting solution is dispersed in water or an aqueous medium and the solvent is removed via distillation. In any of these methods, a surfactant such as sodium lauryl sulfate, sodium dodecylbenzenesulfate or polyethylene glycol, or a water-soluble resin such as polyvinyl alcohol may be appropriately used as a dispersing agent or a stabilizing agent.

Thermoplastic particles are preferably dispersible in water. The average particle size thereof is preferably 0.01-10 μm, and more preferably 0.1-3 μm.

The composition of the thermoplastic particles may continuously vary from the interior to the surface of the particles, and the particles may be covered with a different material. A commonly known microcapsule production method or a sol-gel method can be employed for covering the particles.

The content of thermoplastic particles in the image formation layer, made of polyolefin and the like, is preferably 1-90% by weight, and more preferably 5-80% by weight based on the total layer weight.

The image formation layer of the present invention may further contain a water-soluble material. When an image formation layer at unexposed portions is removed on a printing press employing dampening water and ink, the removal performance can be improved.

A water-soluble resin provided as a material capable of being contained in a hydrophilic-layer is employed as a water-soluble material. These water-soluble resins capable of being used for an image formation layer in the present invention can be selected from hydrophilic natural polymers and synthetic polymers. Specific examples of the water-soluble resin which are preferably used in the present invention include natural polymers such as gum arabic, water-soluble soybean polysaccharides, cellulose derivatives (such as carboxymethyl cellulose, carboxyethyl cellulose, methylcellulose and the like, for example), there modified products, white dextrin, pullulan, enzymolysis etherified dextrin and the like, as well as synthetic polymers such as polyvinyl alcohol (preferably with a saponification degree of not less than 70% by mol), polyacrylic acid, its alkaline metal salt or its amine salt, polyacrylic acid copolymer, its alkaline metal salt or its amine salt, polymethacrylic acid, its alkaline metal salt or its amine salt, vinyl alcohol-acrylic acid copolymer, its alkaline metal salt or its amine salt, polyacrylamide, its copolymer, polyhydroxyethyl acrylate, polyvinyl pyrrolidone, its copolymer, polyvinylmethyl ether, vinylmethyl ether-maleic acid anhydride copolymer, poly-2-acrylamide-2-methyl-1-propane sulfonic acid, its alkaline metal salt or its amine salt, poly-2-acrylamide-2-methyl-1-propane sulfonic acid copolymer, its alkaline metal salt or its amine salt and the like. These can also be used in admixture combination with two kinds or more.

The content of water-soluble resin in the image formation layer is preferably 1-50% by weight, and more preferably 2-30% by weight based on the total layer weight.

The image formation of planographic printing plate material in the present invention can be carried out by imagewise applying heat, and a method employing a thermal head or an infrared (thermal) laser is provided as an imagewise heating method.

The imagewise heating method is preferably a method of imagewise applying heat particularly via image exposure of an infrared laser.

The image exposure is preferably scanning exposure, which is carried out employing a laser which can emit light having a wavelength of infrared and/or near-infrared regions, that is, a wavelength of 700-1500 nm. As the laser, a gas laser can be used, but a semi-conductor laser, which emits light having a near-infrared region wavelength, is preferably used.

A device suitable for the scanning exposure may be any device capable of forming an image on the printing plate material according to image signals from a computer employing the semi-conductor laser.

Generally, the following scanning exposure processes are mentioned.

(1) A process in which a plate precursor provided on a fixed horizontal plate is scanning exposed in two dimensions, employing one or several laser beams.

(2) A process in which the surface of a plate precursor provided along the inner peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

(3) A process in which the surface of a plate precursor provided along the outer peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

In the present invention, the process (3) above is preferable, and especially preferable when a printing plate material mounted on a plate cylinder of a printing press is scanning exposed.

It is preferable that the image formation layer of the present invention is a layer capable of being developed on a printing press. The image formation layer capable of being developed on a printing press is a layer in which an image formation layer at non-image portions are removed particularly via no developing treatment by supplying dampening water, or dampening water and printing ink on the press, after conducting the above imagewise heating process, and a hydrophilic layer is exposed at this removed portion, whereby this exposed portion becomes a non-image portion during printing.

Preferably employed in the present invention is a printing method via conducting a developing process by supplying dampening water, or dampening water and printing ink on a planographic printing press, after forming images on a planographic printing plate material of the present invention employing a thermal head or an infrared laser.

A conventional planographic printing press equipped with a dampening water supplying device can be used for the printing method of the present invention.

(Hydrophilic Layer)

A hydrophilic layer is a layer capable of being a non-image portion in which no printing ink is received during printing, and contains spherical silica particles having a particle diameter of 5.0-7.0 μm or hydrophilic materials. The hydrophilic layer preferably contains a light-to-heat material. The light-to-heat material generates heat upon image exposure to form images on the image formation layer.

(Spherical Silica Particle)

The hydrophilic layer of the present invention contains spherical silica particles having a particle diameter of 5.0-7.0 μm, and a content of the spherical silica particles having a particle diameter of 5.0-7.0 μm is not less than 60% by volume, based on the total volume of particles having a particle diameter of 2-10 μm contained in the hydrophilic layer.

The spherical silica particle means a silica particle having a needle-like shape ratio of 1-1.5. The needle-like shape ratio means a ratio of a long axis to a short axis diameter (long axis diameter/short axis diameter).

The needle-like shape ratio is preferably 1-1.3, and more preferably 1-1.1.

The particle diameter described here means the primary particle diameter, and also a diameter of a circle having the area corresponding to projected area of a particle.

"As to the above-mentioned content ratio of spherical silica particles, the content ratio is not less than 60% in terms of volume, based on the total volume of particles having a particle diameter of 2-10 μm contained in the hydrophilic layer" means that a content of spherical silica particles having a particle diameter of 5.0-7.0 μm is not less than 60% by volume, based on the total volume of particles having a particle diameter of 2-10 μm contained in the hydrophilic layer. In this case, the particle diameter is also defined as described above.

The content of spherical silica particles is not less than 60% by volume, but the content is preferably 65-98% by volume, and more preferably 70-94%.

This volume content can be determined by integrating the numerical value obtained from a measured particle diameter distribution curve (a relation between the particle diameter and the content in terms of volume conversion).

It is preferable that a CV value in the particle diameter distribution of spherical silica particles having a particle diameter of 5.0-7.0 μm contained in the hydrophilic layer is 10% or less.

When the hydrophilic layer contains spherical silica particles satisfying the above particle diameter and the CV value, and the above image formation layer contains polyethylene wax of the present invention, the uneven surface of the hydrophilic layer and the image formation layer can be controlled, so that not only printing durability during printing employing powder, and wear resistance of the image formation layer against foreign matter in the case of using a lot of paper powder, but also scratch resistance and image visualization at non-image portions can be effectively improved.

The CV value is a value called a variation coefficient, and also is an indicator exhibiting a relative distribution spread.

The less the value, the less the particle diameter distribution spread is. Though no comparison can be made since standard deviation is affected by scale, a degree of the distribution spread can mutually be compared in this case even though the value posesses a different unit, since the variation coefficient eliminates the scale influence from the standard deviation.

The variation coefficient can be calculated from a mean value and standard deviation, since variation of measured values obtained via repeated measurement exhibits a normal distribution.

$$CV(\%)=(\text{standard deviation of particle diameter}/\text{average particle diameter})\times 100$$

The above average particle diameter is a mean value of the primary particle diameter. In order to obtain the primary particle diameter, a Coulter counter is corrected employing a standard particle having a known particle diameter, and the average particle diameter and particle diameter distribution (CV value) are determined employing a corrected Coulter counter.

The CV value is preferably 1-10% in view of printing suitability and scratch resistance, and more preferably 1-6%.

In view of film strength, scratch resistance, and printing suitability, the content of spherical silica particles in the present invention is preferably 3-40% by weight, base on the total solid content of a hydrophilic layer, and more preferably 5-25% by weight.

The hydrophilic layer of the present invention may be composed of multi-layers, and may also be preferably composed of an upper hydrophilic layer and a lower hydrophilic layer constituting a double layer structure.

In the case of a double layer structure, it is preferred that spherical silica particles of the present invention are contained in the lower hydrophilic layer, and the content of spherical silica particles is preferably 10-30% by weight, based on the total solid content of the lower hydrophilic layer.

Thickness of the hydrophilic layer is preferably 2-5 μm, and more preferably 2-4 μm. It is preferable that the particle diameter of a spherical silica particle is 1.5-2.5 times larger than the thickness of the hydrophilic layer, and more preferably 1.8-2.3 times larger than the thickness (spherical particles having an average particle diameter of 3.0-4.0 μm). It is preferred that a hydrophilic layer of the present invention further contains inorganic particles or particles covered by an inorganic material having a particle diameter of 1-12 μm as particles other than spherical silica particles of the present invention.

The particle diameter of these particles is preferably 2-10 μm, and more preferably 3-8 μm.

Of these, spherical particles having a particle diameter of 3-4 μm are particularly preferable.

These particles are used in combination with spherical silica particles of the present invention, whereby printing durability and scratch resistance at non-image portions are improved. Spherical silica particles having a particle diameter of 3-4 μm are placed at revealed portions of an image layer around spherical silica particles, so that performance is presumably improved.

As for a preferred embodiment of the present invention, it is preferred that the hydrophilic layer is composed of two layers, and the lower hydrophilic layer contains spherical silica particles having a particle diameter of 3-4 μm.

The addition amount of particles having a particle diameter of 1-12 μm is preferably 0.5-50% by weight, based on the total solid content of the hydrophilic layer, and more preferably 3-30% by weight.

As for the composition and the structure of these particles, any of a porous substance, a non-porous substance, organic resin particles or inorganic particles can be used. Examples of the inorganic fillers include silica, alumina, zirconia, titania, carbon black, graphite, $TiO_2$, $BaSO_4$, ZnS, $MgCO_3$, $CaCO_3$, ZnO, CaO, $WS_2$, $MoS_2$, MgO, $SnO_2$, $Al_2O_3$, $\alpha$-$Fe_2O_3$, $\alpha$-FeOOH, SiC, $CeO_2$, BN, SiN, MoC, BC, WC, titanium carbide, corundum, artificial diamond, garnet, garnet, quartz, silica rock, tripoli, diatomite, and dolomite. Examples of the organic fillers include polyethylene fine particles, fluororesin particles, guanamine resin particles, acrylic resin particles, silicone resin particles, melamine resin particles, and the like.

There are also, for example, particles in which organic particles such as particles of PMMA or polystyrene as core particles are coated with inorganic particles with a particle diameter smaller than that of the core particles. The particle diameter of the inorganic particles is preferably from 1/10 to 1/100 of that of the core particles. As the inorganic particles, particles of known metal oxides such silica, alumina, titania and zirconia can be used. Various coating methods can be used, but a dry process is preferred which core particles collide with particles for coating at high speed in air as in a hybridizer to push the particles for coating in the core particle surface and fix, whereby the core particles are coated with the particles for coating.

(Light-to-Heat Conversion Material)

An image formation layer or a hydrophilic layer in the present invention preferably contains a light-to-heat conversion material, and the light-to-heat conversion material is contained more preferably in a hydrophilic layer.

It is preferred that the following metal oxides are added particularly into the hydrophilic layer as a light-to-heat conversion material.

Materials having black color in the visible regions or materials, which are electro-conductive or semi-conductive, can be used as light-to-heat conversion materials.

Examples of the former include black iron oxide ($Fe_3O_4$) and black complex metal oxides containing at least two metals. Examples of the latter include Sb-doped $SnO_2$ (ATO), Sn-added $In_2O_3$ (ITO), $TiO_2$, TiO prepared by reducing $TiO_2$ (titanium oxide nitride, generally titanium black). Particles prepared by covering a core material such as $BaSO_4$, $TiO_2$, $9Al_2O_3.2B_2O$ and $K_2O.nTiO_2$ with these metal oxides is usable. These oxides are particles having a particle diameter of not more than 0.5 μm, preferably not more than 100 nm, and more preferably not more than 50 nm. As these light-to-heat conversion materials, black iron oxide or black complex metal oxides containing at least two metals are more preferred. Examples of the black complex metal oxides include complex metal oxides comprising at least two selected from Al, Ti, Cr, Mn, Fe, Co, Ni, Cu, Zn, Sb, and Ba. These can be prepared according to the methods disclosed in Japanese Patent O.P.I. Publication Nos. 9-27393, 9-25126, 9-237570, 9-241529 and 10-231441.

The complex metal oxide used in the invention is preferably a complex Cu—Cr—Mn type metal oxide or a Cu—Fe—Mn type metal oxide. The Cu—Cr—Mn type metal oxides are preferably subjected to the treatment disclosed in Japanese Patent O.P.I. Publication No. 8-27393 in order to reduce isolation of a 6-valent chromium ion. These complex metal oxides have a high color density and a high light-to-heat conversion efficiency as compared with another metal oxide.

The primary average particle diameter of these complex metal oxides is preferably not more than 1.0 μm, and more preferably 0.01-0.5 μm. The primary average particle diameter of not more than 1 μm improves a light-to-heat conversion efficiency relative to the addition amount of the particles, and the primary average particle diameter of 0.01-0.5 μm further improves a light-to-heat conversion efficiency relative to the addition amount of the particles.

The light-to-heat conversion efficiency relative to the addition amount of the particles depends on a dispersity of the particles, and the well-dispersed particles have a high light-to-heat conversion efficiency. Accordingly, these complex metal oxide particles are preferably dispersed according to a known dispersing method, separately to a dispersion liquid (paste), before being added to a coating liquid for the particle containing layer. The metal oxides having a primary average particle diameter of less than 0.01 are not preferred since they are difficult to disperse. A dispersant is optionally used for dispersion. The addition amount of the dispersant is preferably 0.01-5% by weight, and more preferably 0.1-2% by weight, based on the weight of the complex metal oxide particles.

The content of the complex metal oxide in the hydrophilic layer is preferably from 20% by weight to less than 40% by weight, more preferably from 25% by weight to less than 39% by weight, and still more preferably from 25% by weight to less than 30% by weight, based on the total solid amount of hydrophilic layer. The content less than 20% by weight of the oxide provides poor sensitivity, while the content not less than 40% by weight of the oxide produces ablation scum due to ablation.

The hydrophilic layer or image formation layer in the present invention can contain the following infrared absorbing dye as a light-to-heat conversion material. Examples of the infrared absorbing dye include a general infrared absorbing dye such as a cyanine dye, a chloconium dye, a polymethine dye, an azulenium dye, a squalenium dye, a thiopyrylium dye, a naphthoquinone dye or an anthraquinone dye, and an organometallic complex such as a phthalocyanine compound, a naphthalocyanine compound, an azo compound, a thioamide compound, a dithiol compound or an indoaniline compound. Exemplarily, the light-to-heat conversion materials include compounds disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds may be used singly or in combination.

The content of the infrared absorbing dye in the image formation layer is preferably from 0.1% by weight to less than 10% by weight, more preferably from 0.3% by weight to less than 7% by weight, and still more preferably from 0.5% by weight to less than 6% by weight, based on the total solid amount of image formation layer. As is described above, the content less than 0.1% by weight of the oxide provides poor sensitivity, while the content not less than 10% by weight of the oxide produces ablation scum due to ablation.

(Hydrophilic Material)

The following hydrophilic material employed for a hydrophilic layer of the planographic printing plate material in the present invention may be provided, and a hydrophilic matrix is formed by using the hydrophilic material.

Material for forming a hydrophilic matrix phase is preferably a metal oxide. The metal oxide preferably comprises metal oxide particles. Examples of the metal oxide include colloidal silica, alumina sol, titania sol and another metal oxide sol. The metal oxide may have any shape such as spherical shape, feather-like shape, and the like. The average particle size is preferably 3-100 nm, and plural kinds of metal oxide each having a different size may be used in combination. The surface of the particles may be subjected to surface treatment.

The above-mentioned metal oxide particles can be used as a binder, utilizing its layer forming ability. The metal oxide particles are suitably used in a hydrophilic layer since they minimize lowering of the hydrophilicity of the layer as compared with an organic compound binder.

Among the above-mentioned, colloidal silica is particularly preferred in the present invention. The colloidal silica has a high layer forming ability under a drying condition with a relative low temperature, and can provide excellent layer strength.

It is preferred that the above colloidal silica is necklace-shaped colloidal silica or colloidal silica particles having an average particle size of not more than 20 nm, each being described later. Further, it is preferred that the colloidal silica provides an alkaline colloidal silica solution as a colloid solution.

The necklace-shaped colloidal silica to be used in the present invention is a generic term of an aqueous dispersion system of a spherical silica having a primary particle size of the order of nm.

The necklace-shaped colloidal silica means a "pearl necklace-shaped" colloidal silica formed by connecting spherical colloidal silica particles each having a primary particle size of 10-50 μm so as to attain a length of 50-400 nm.

The term of "pearl necklace-shaped" means that the image of connected colloidal silica particles is like to the shape of a pearl necklace.

The bonding between the silica particles forming the necklace-shaped colloidal silica is considered to be —Si—O—Si—, which is formed by dehydration of —SiOH groups located on the surface of the silica particles.

Specific examples of the necklace-shaped colloidal silica include Snowtex-PS series produced by Nissan Kagaku Kogyo, Co., Ltd.

As the products, there are Snowtex-PS-S (the average particle size in the connected state is approximately 110 nm), Snowtex-PS-M (the average particle size in the connected state is approximately 120 nm) and Snowtex-PS-L (the average particle size in the connected state is approximately 170 nm). Acidic colloidal silicas corresponding to each of the above-mentioned are Snowtex-PS-S-O, Snowtex-PS-M-O and Snowtex-PS-L-O, respectively.

The necklace-shaped colloidal silica is preferably used in a hydrophilic layer as a porosity providing material for hydrophilic matrix phase, and porosity and strength of the layer can be secured by its addition to the layer. Among them, the use of Snowtex-PS-S, Snowtex-PS-M or Snowtex-PS-L, each being alkaline colloidal silica particles, is particularly preferable since the strength of the hydrophilic layer is increased and occurrence of background contamination is inhibited even when a lot of prints are printed.

It is known that the binding force of the colloidal silica particles becomes larger with decrease of the particle size. The average particle size of the colloidal silica particles to be used in the present invention is preferably not more than 20 nm, and more preferably 3-15 nm. As mentioned above, the alkaline colloidal silica particles show the effect of inhibiting occurrence of the background contamination. Accordingly, the use of the alkaline colloidal silica particles is particularly preferable.

Examples of the alkaline colloidal silica particles having the average particle size within the foregoing range include Snowtex-20 (average particle size: 10-20 nm), Snowtex-30 (average particle size: 10-20 nm), Snowtex-40 (average particle size: 10-20 nm), Snowtex-N (average particle size: 10-20 nm), Snowtex-S (average-particle size: 8-11 nm) and Snowtex-XS (average particle size: 4-6 nm), each produced by Nissan Kagaku Co., Ltd.

The colloidal silica particles having an average particle size of not more than 20 nm, when used together with the necklace-shaped colloidal silica as described above, is particularly preferred, since porosity of the layer is maintained and the layer strength is further increased.

The ratio of the colloidal silica particles having an average particle size of not more than 20 nm to the necklace-shaped colloidal silica is preferably 95/5-5/95, more preferably 70/30-20/80, and most preferably 60/40-30/70.

The porous material of a hydrophilic layer matrix in the present invention contains porous metal oxide particles having a particle diameter of less than 1 μm. Preferable examples of the porous metal oxide particles include porous silica particles, porous aluminosilicate particles or zeolite particles as described later.

The porous silica particles are ordinarily produced by a wet method or a dry method. By the wet method, the porous silica particles can be obtained by drying and pulverizing a gel prepared by neutralizing an aqueous silicate solution, or pulverizing the precipitate formed by neutralization. By the dry method, the porous silica particles are prepared by combustion of silicon tetrachloride together with hydrogen and oxygen to precipitate silica.

The porosity and the particle size of such particles can be controlled by variation of the production conditions. The porous silica particles prepared from the gel by the wet method is particularly preferred.

The porous aluminosilicate particles can be prepared by the method described in, for example, Japanese Patent O.P.I. Publication No. 10-71764. Thus prepared aluminosilicate particles are amorphous complex particles synthesized by hydrolysis of aluminum alkoxide and silicon alkoxide as the major components. The particles can be synthesized so that the ratio of alumina to silica in the particles is within the range of from 1:4 to 4:1. Complex particles composed of three or more components prepared by an addition of another metal alkoxide may also be used in the invention. In such a particle, the porosity and the particle size can be controlled by adjustment of the production conditions.

The porosity of the particles is preferably not less than 0.5 ml/g, more preferably not less than 0.8 ml/g, and most preferably 1.0-2.5 ml/g, in terms of pore volume.

The pore volume is closely related to water retention of the coated layer. As the pore volume increases, the water retention is increased, contamination is difficult to occur, and the water retention latitude is broad. Particles having a pore volume of more than 2.5 ml/g are brittle, resulting in lowering of durability of the layer containing them. Particles having a pore volume of less than 0.5 ml/g may be insufficient in printing performance.

Zeolite can be employed as a porous material in the present invention. Zeolite is a crystalline aluminosilicate, which is a porous material having voids of a regular three dimensional net work structure and having a pore size of 0.3-1 nm.

Natural and synthetic zeolites are expressed by the following formula.

$$(M_1 \cdot M_{21/2})_m(Al_mSi_nO_{2(m+n)}) \cdot xH_2O$$

In the above, $M_1$ and $M_2$ are each exchangeable cations. Examples of $M_1$ include $Li^+$, $Na^+$, $K^+$, $Tl^+$, $Me_4N^+$ (TMA), $Et_4N^+$ (TEA), $Pr_4N^+$ (TPA), $C_7H_{15}N_2^+$, and $C_8H_{16}N^+$, and examples of $M^2$ include $Ca^{2+}$, $Mg^{2+}$, $Ba^{2+}$, $Sr^{2+}$ and $C_8H_{18}N_2^{2+}$. Relation of n and m is $n \geqq m$, and consequently, the ratio of m/n, or that of Al/Si is not more than 1. A higher Al/Si ratio shows a higher content of the exchangeable cation, and a higher polarity, resulting in higher hydrophilicity. The Al/Si ratio is within the range of preferably 0.4-1.0, and more preferably 0.8-1.0. x is an integer.

Synthetic zeolite having a stable Al/Si ratio and a sharp particle size distribution is preferably used as the zeolite particles to be used in the invention. Examples of such zeolite include Zeolite A: $Na_{12}(Al_{12}Si_{12}O_{48}) \cdot 27H_2O$; Al/Si=1.0, Zeolite X: $Na_{86}(Al_{86}Si_{106}O_{384}) \cdot 264H_2O$; Al/Si=0.811, and Zeolite Y: $Na_{56}(Al_{56}Si_{136}O_{384}) \cdot 250H_2O$; Al/Si=0.412.

Containing the porous zeolite particles having an Al/Si ratio within the range of 0.4-1.0 in the hydrophilic layer greatly raises the hydrophilicity of the hydrophilic layer itself, whereby contamination in the course of printing is inhibited and the water retention latitude is also increased. Further, contamination caused by a finger mark is also greatly reduced. When Al/Si is less than 0.4, the hydrophilicity is insufficient and the above-mentioned improving effects are lowered.

The hydrophilic layer matrix of a printing plate material in the present invention can contain layer structural clay mineral particles as a metal oxide. Examples of the layer structural clay mineral particles include a clay mineral such as kaolinite, halloysite, talk, smectite such as montmorillonite, beidellite, hectorite and saponite, vermiculite, mica and chlorite; hydrotalcite; and a layer structural polysilicate such as kanemite, makatite, ilerite, magadiite and kenyte. Among them, ones having a higher electric charge density of the unit layer are higher in the polarity and in the hydrophilicity. Preferable charge density is not less than 0.25, more preferably not less than 0.6. Examples of the layer structural mineral particles having such a charge density include smectite having a negative charge density of 0.25-0.6 and bermiculite having a negative charge density of 0.6-0.9. Synthesized fluorinated mica is preferable since one having a stable quality, such as the particle size, is available. Among the synthesized fluorinated mica, swellable one is preferable and one freely swellable is more preferable.

An intercalation compound of the foregoing layer structural mineral particles such as a pillared crystal, or one treated by an ion exchange treatment or a surface treatment such as a silane coupling treatment or a complication treatment with an organic binder is also usable.

With respect to the size of the planar structural mineral particles, the particles have an average particle size (an average of the largest particle length) of preferably less than 1 μm, and an average aspect ratio (the largest particle length/the particle thickness of preferably not less than 50 in a state contained in the layer including the case that the particles are subjected to a swelling process and a dispersing layer-separation process. When the particle size is within the foregoing range, continuity to the parallel direction, which is a trait of the layer structural particle, and softness, are given to the coated layer so that a strong dry layer in which a crack is difficult to be formed can be obtained. The coating solution containing the layer structural clay mineral particles in a large amount can minimize particle sedimentation due to a viscosity increasing effect. The particle size greater than the foregoing may produce a non-uniform coated layer, resulting in poor layer strength. The aspect ratio lower than the foregoing reduces the planar particles, resulting in insufficient viscosity increase and reduction of particle sedimentation inhibiting effect.

The content of the layer structural clay mineral particles is preferably 0.1-30% by weight, and more preferably 1-10% by weight based on the total weight of the layer. Particularly, the addition of the swellable synthesized fluorinated mica or smectite is effective if the adding amount is small. The layer structural clay mineral particles may be added in the form of powder to a coating liquid, but it is preferred that gel of the particles which is obtained by being swelled in water, is added to the coating liquid in order to obtain a good dispersity according to an easy coating liquid preparation method which requires no dispersion process comprising dispersion due to media.

The following material may be used in view of no performance deterioration.

An aqueous solution of a silicate can also be employed. An alkali metal silicate such as sodium silicate, potassium silicate or lithium silicate is preferable, and the $SiO_2/M_2O$ is preferably selected so that the pH value of the coating liquid after addition of the silicate exceeds 13 in order to prevent dissolution of the porous metal oxide particles or the colloidal silica particles.

An inorganic polymer or an inorganic-organic hybrid polymer prepared by a sol-gel method employing a metal alkoxide. Known methods described in S. Sakka "Application of Sol-Gel Method" published by AGNE SHYOFUSHA or in the publications cited in the above-mentioned publication can be applied to prepare the inorganic polymer or the inorganic-organic hybrid polymer by the sol-gel method.

A water soluble resin may also be contained. Examples of the water soluble resin include polysaccharides, polyethylene oxide, polypropylene oxide, polyvinyl alcohol, polyethylene glycol (PEG), polyvinyl ether, a styrene-butadiene copolymer, a conjugation diene polymer latex of methyl methacrylate-butadiene copolymer, an acryl polymer latex, a vinyl polymer latex, polyacrylamide, and polyvinyl pyrrolidone. In the invention, polysaccharides are preferably used as the water soluble resin.

As the polysaccharide, starches, celluloses, polyuronic acid and pullulan can be used. Among them, a cellulose derivative such as a methyl cellulose salt, a carboxymethyl cellulose salt or a hydroxyethyl cellulose salt is preferable, and a sodium or ammonium salt of carboxymethyl cellulose is more preferable.

These polysaccharides can form a preferred surface shape of the hydrophilic layer.

The surface of the hydrophilic layer preferably has a convexoconcave structure having a pitch of 0.1-20 μm such as the grained aluminum surface of an aluminum PS plate.

The water retention ability and the image maintaining ability are raised by such a convexoconcave structure of the surface. Such a convexoconcave structure can also be formed by adding in an appropriate amount a filler having a suitable particle size to the coating liquid of the hydrophilic layer. However, the convexoconcave structure is preferably formed by coating a coating liquid for the hydrophilic layer containing the alkaline colloidal silica and the water-soluble polysaccharide so that the phase separation occurs at the time of drying the coated liquid, whereby a structure is obtained which provides a good printing performance.

The shape of the convexoconcave structure such as the pitch and the surface roughness thereof can be suitably controlled by the kinds and the adding amount of the alkaline colloidal silica particles, the kinds and the adding amount of the water-soluble polysaccharide, the kinds and the adding amount of another additive, a solid concentration of the coating liquid, a wet layer thickness or a drying condition.

In the present invention, it is preferred that the water soluble resin contained in the hydrophilic matrix phase is water soluble, and at least a part of the resin exists in the hydrophilic layer in a state capable of being dissolved in water. If a water soluble material is cross-linked by a crosslinking agent and is insoluble in water, its hydrophilicity is lowered, resulting in problem of lowering printing performance.

A cationic resin may also be contained in the hydrophilic layer. Examples of the cationic resin include a polyalkylene-polyamine such as a polyethyleneamine or polypropylenepolyamine or its derivative, an acryl resin having a tertiary amino group or a quaternary ammonium group and diacrylamine. The cationic resin may be added in a form of fine particles. Examples of such particles include the cationic microgel described in Japanese Patent O.P.I. Publication No. 6-161101.

A water-soluble surfactant may be added for improving the coating ability of the coating liquid for the hydrophilic layer in the present invention. A silicon atom-containing surfactant and a fluorine atom-containing surfactant are preferably used. The silicon atom-containing surfactant is especially preferred in that it minimizes printing contamination. The content of the surfactant is preferably from 0.01 to 3% by weight, and more preferably from 0.03 to 1% by weight based on the total weight of the hydrophilic layer (or the solid content of the coating liquid).

The hydrophilic layer in the invention can contain a phosphate. Since a coating liquid for the hydrophilic layer is preferably alkaline, the phosphate to be added to the hydrophilic layer is preferably sodium phosphate or sodium monohydrogen phosphate. The addition of the phosphate provides improved reproduction of dots at shadow portions. The content of the phosphate is preferably from 0.1 to 5% by weight, and more preferably from 0.5 to 2% by weight in terms of amount excluding hydrated water.

(Backing Layer)

In the printing plate material of the present invention, it is preferred that at least one backing layer is provided on the surface of the support opposite the image formation layer, in order to improve handling properties and minimize change in physical properties during storage. It is preferred that a backing layer contains a hydrophilic binder, and the hydrophobic binder may be water dispersible resins disclosed in Japanese Patent O.P.I. Publication No. 2002-258469, sections [0033] through [0038], as long as it can make the surface of the printing plate material hydrophobic.

The hydrophilic binder may be any as long as it exhibits hydrophilicity, and examples of the hydrophilic binder include resins having, as a hydrophilic group, a hydroxyl group such as polyvinyl alcohol (PVA), cellulose resins (methylcellulose MC, ethylcellulose EC, hydroxyethylcellulose HEC, carboxymethylcellulose CMC), chitins, or starch; resins having an ether bond such as polyethylene oxide PEO, polypropylene oxide PPO, polyethylene glycol PEG, or polyvinyl ether PVE; resins having an amide group or an amide bond such as polyacryl amide PAAM or polyvinyl pyrrolidone PVP; resins having as a dissociation group a carboxyl group such as polyacrylic acid salts, maleic acid resins, alginates or gelatins; polystyrene sulfonic acid salt; resins having an amino group, an imino group, a tertiary amino group or a quaternary ammonium group such as polyallylamine PAA, polyethylene imine PEI, epoxidated polyamide EPAM, polyvinyl pyridine or gelatins.

The hydrophobic binder may be any as long as it exhibits hydrophobicity, and examples of the hydrophobic binder include polymers derived from α,β-ethylenically unsaturated monomers such as polyvinyl chloride, chlorinated polyvinyl chloride, a copolymer of vinyl chloride and vinylidene chloride, a copolymer of vinyl chloride, and vinyl acetate, polyvinyl acetate, partially saponified polyvinyl acetate, polyvinyl acetal or preferably polyvinyl butyral in which a part of polyvinyl alcohol is acetalized with aldehyde, a copolymer of acrylonitrile and acryl amide, polyacrylates, polymethacrylates, polystyrene, polyethylene and a mixture thereof.

It is preferred that the backing layer contains a matting agent, in order to easily mount the printing plate on a printing press and to prevent "out of color registration" due to "out of registration" of the printing plate during printing. As the matting agent, a porous or non-porous matting agent or an organic or inorganic matting agent can be used. Examples of the inorganic matting agent include silica, alumina, zirconia, titania, carbon black, graphite, $TiO_2$, $BaSO_4$, ZnS, $MgCO_3$, $CaCO_3$, ZnO, CaO, $WS_2$, $MoS_2$, MgO, $SnO_2$, $Al_2O_3$, $\alpha$-$Fe_2O_3$, $\alpha$-FeOOH, SiC, $CeO_2$, BN, SiN, MoC, BC, WC, titanium carbide, corundum, artificial diamond, garnet, garnet, quartz, silica rock, tripoli, diatomite, and dolomite. Examples of the organic matting agent include polyethylene fine particles, fluororesin particles, guanamine resin particles, acrylic resin particles, silicone resin particles, melamine resin particles, and the like. As the inorganic material coated fillers, there are, for example, particles in which organic particles such as particles of PMMA or polystyrene as core particles are coated with inorganic particles with a particle diameter smaller that that of the core particles. The particle diameter of the inorganic particles is preferably 1/10-1/100 of that of the core particles. As the inorganic particles, particles of known metal oxides such silica, alumina, titania and zirconia can be used. Various coating methods can be used, but a dry process is preferred which core particles collide with particles for coating at high speed in air as in a hybridizer to push the particles for coating in the core particle surface and fix, whereby the core particles are coated with the particles for coating.

Any matting agent is not limited to be used, and can be available if the matting agent satisfies the range of the present invention. In the case of a planographic printing plate material in the form of roll, the matting agent in the back coat layer is preferably organic resin particles in minimizing scratches on the image formation layer surface.

The average particle diameter of the matting agent in the present invention is determined in terms of an average diameter of circles having the same area as projected images of the particles photographed by means of an electron microscope.

The average particle diameter of the matting agent is preferably 1-12 μm, more preferably 1.5-8 μm, and still more preferably 2-7 μm. In the case of the particle diameter exceeding 12 μm, scratches on the image formation layer can be easily generated, and in the case of a particle diameter of 1 μm, fixation of a planographic printing plate material is also generated to a plate cylinder. The matting agent content is preferably 0.2-30% by weight, and more preferably 1-10% by weight, based on the total back coat layer weight.

A laser recording apparatus or a processless printing press has a sensor for controlling transportation of the printing plate material. In the present invention, in order to carry out the controlling smoothly, the structural layer preferably contains dyes or pigment. The dyes or pigment are preferably infrared absorbing dyes or pigment as described above used as a light-to-heat conversion material. The structural layer can further contain a surfactant.

(Support)

Materials for the support in the present invention are preferably plastic sheets. Examples thereof include polyethylene terephthalate (PET), polyethylene naphthalate (PEN), polyimide, polyamide, polycarbonate, polysulfone, polyphenylene oxide, and cellulose ester. Of these, PET and PEN of polyester are particularly preferable in view of a handling property and so forth.

PET is composed of terephthalic acid and ethylene glycol, and PEN is also composed of naphthalene dicarboxylic acid and ethylene glycol. These are combined via polycondensation under the appropriate reaction condition employing a catalyst. In this case, one or more kinds of a third component may be appropriately mixed. The third component may be a functional compound capable of forming ester, and examples of dicarboxylic acid can be provided as shown below.

As a dicarboxylic acid, there is, for example, isophthalic acid, phthalic acid, 2,6-naphthalene dicarboxylic acid, 2,7-naphthalene dicarboxylic acid, diphenylsulfone dicarboxylic acid, diphenylether dicarboxylic acid, diphenylethane dicarboxylic acid, cyclohexane dicarboxylic acid, diphenyl dicarboxylic acid, diphenylthioether dicarboxylic acid, diphenylketone dicarboxylic acid, or diphenylindane dicarboxylic acid.

As a glycol, there is, for example, ethylene grycol, propylene glycol, tetramethylene glycol, cyclohexanedimethanol, 2,2-bis(4-hydroxyphenyl)propane, 2,2-bis(4-hydroxyethoxyphenyl)propane, bis(4-hydroxyphenyl)-sulfone, bisphenolfluorene dihydroxyethyl ether, diethylene glycol, neopentylene glycol, hydroquinone, or cyclohexane diol.

The intrinsic viscosity of PET resin in the present invention is preferably 0.5-0.8. PET resins having different viscosity may be used as an admixture.

A synthesis method of PET is not specifically limited, and PET can be manufactured according to a conventional manufacturing method. As the manufacturing method, there is a direct esterification method in which a dicarboxylic acid component is directly reacted with a diol component, or an ester exchange method in which dialkylester is first employed as dicarboxylic acid, and this one and the diol component are polymerized via the ester exchange reaction by heat application to be esterified while removing the extra diol under reduced pressure. In this case, an ester exchange catalyst, a polymerization catalyst or a heat-resistant stabilizer can be added. Examples of the heat stabilizer include phosphoric acid, phosphorous acid, and ester compounds thereof. During synthesis, an anti-stain agent, a crystal nucleus agent, a slipping agent, a stabilizer, an anti-blocking agent, a UV absorber, a viscosity adjusting agent, a transparentizing agent, an anti-static agent, a pH adjusting agent, a dye or pigment may be added.

Next, a manufacturing method of the planographic printing plate material in the present invention will be explained.

A method of preparing an unstretched sheet and a sheet which is uniaxially stretched in the longitudinal direction can be a commonly known method. Polyester as a raw material is molded in the form of pellets, and after a hot-air drying process or a vacuum drying, they are melted and extruded in the form of sheets by a T-shaped die. Subsequently, they are attached firmly onto a cooling drum and cooled rapidly to obtain an unstretched sheet. Next, the resulting unstretched sheet is heated in the range of from the glass transition temperature (Tg) to Tg+100° C. via plural rollers and/or heating apparatuses such as an infrared heater and the like to be stretched in the longitudinal direction. The stretching magnification is usually 2.5-6.

In this case, a roll-set curl can be avoided by arranging a stretching temperature difference between both surfaces of a support. Specifically, temperature can be controlled by providing a heating apparatus such as an infrared heater or such on one surface side during heating while stretching in the longitudinal direction. The temperature difference at the time of stretching is preferably 0-40° C., and more preferably 0-20° C. In the case of the temperature difference exceeding 40° C., it is not preferable that film sheet flatness is degraded because of uneven stretching.

Next, the resulting polyester film sheet which is uniaxially stretched in the longitudinal direction is stretched in the transverse direction in the temperature range of from Tg to Tg+120° C., and subsequently fixed by heat. The transverse stretching magnification is usually 3-6, and the ratio of longitudinal and transverse stretching magnifications is appropriately adjusted so as to have a preferable property via measuring of properties of the resulting biaxially stretching film sheet. As to heat fixation, a heat fixation process is usually conducted in the temperature range of not more than Tg+180° C., which is higher than the final transverse stretching temperature, for 0.5-300 sec. In this case, film sheets are preferably heat fixed with two or more temperatures. Dimension stability of the film sheets heat fixed with such the two or more temperatures is improved, whereby a support can usefully be provided for the printing plate material.

The support for the printing plate material in the present invention is preferably subjected to relaxation treatment in view of dimension stability. The relaxation treatment can preferably be conducted before a roll-up process in a tenter for stretching in the transverse direction or in the exterior of the tenter after heat fixing in the stretching process of the foregoing polyester film sheet. The relaxation treatment is preferably carried out in a temperature of 80-200° C., and more preferably 100-180° C. The relaxation treatment is also carried out preferably in a rate of 0.1-10% in both longitudinal and transverse directions, and more preferably in a rate of 2-6%.

(Particles)

Particles having a size of 0.01-10 μm are preferably incorporated in an amount of 1-1000 ppm into the support, in improving handling property. Herein, the particles may be organic or inorganic material. Examples of the inorganic material include silica described in Swiss Patent 330158, glass powder described in French Patent 296995, and carbonate salts of alkaline earth metals, cadmium or zinc described in British Patent 1173181. Examples of the organic material include starch described in U.S. Pat. No. 2,322,037, starch derivatives described such as in Belgian Patent 625451 and British Patent 981198, polyvinyl alcohol described in Japanese Patent Examined Publication No. 44-3643, polystyrene or polymethacrylate described in Swiss Patent 330158, polyacrylonitrile described in U.S. Pat. No. 3,079,257 and polycarbonate described in U.S. Pat. No. 3,022,169. The shape of the particles may be in a regular form or irregular form.

The support in the present invention has a coefficient of elasticity of preferably 300-800 kg/mm$^2$, and more preferably 400-600 kg/mm$^2$, in view of the above handling property. The coefficient of elasticity herein referred to is a slope of the straight line portion in the stress-strain diagram showing the relationship between strain and stress, which is obtained employing a tension test meter according to JIS C2318. This slope is called Young's modulus. In the present invention, it is defined that the foregoing Young's modulus is the coefficient of elasticity.

The support in the present invention has an average thickness of preferably in the range between 100 and 500 μm, and a thickness dispersion of preferably not more than 5%, in that a handling property is improved when the foregoing printing plate material is mounted on a press. The average thickness of the support is most preferably 120-300 μm, and the thickness dispersion of the support is most preferably not more than 2%. The thickness dispersion of the support is determined according to the following: lines are formed at an interval of 10 cm in both the transverse and longitudinal directions on a 60 cm square polyester film sheet to form 36 small squares. The thicknesses of the 36 small squares are measured, and the average thickness, maximum thickness and minimum thickness are obtained.

The plastic support of the present invention may be subjected to heat treatment to reduce the roll-set curl. Provided as the heat treating method are a method of heat treating before and after rolling up in the form of roll after coat drying of each structural layer of the printing plate material, and also a method of heat treating by using a transport line during coat drying.

As a method of heat treating in the form of roll, there is a method of heat treating at a temperature below the glass transition temperature for 0.1-1500 hours after preparing a polyester support, as described in Japanese Patent O.P.I. Publication No. 51-16358. In this case, it is preferred to conduct processes such as a process of embossing at the film edge and center portion partially or over the entire length of the film sheet, a process of bending at the edge, and a process of thickening the film thickness partially in view of a film-to-film anti-blocking. It is preferable that sufficient strength is arranged to such an extent that no film rolling deflection occurs, and material quality and structure capable of being resistant to the heat treating temperature in order to avoid deformation caused by the roll core transfer.

As for a method of heat treatment by using a transport line, the roll-set curl can be minimized by heat treating while transporting a zone having a temperature slope between a glass transition temperature and not less than the glass transition temperature, as described in Japanese Patent O.P.I. Publication No. 10-39448. Though a longer period of time is preferred for heat treatment, it is preferred to heat treat while transporting in CS: 5-50 m/min in view of productivity as well as transportability. Transport tension is not particularly specified, but a transport tension of 5-60 kg/m is preferred. In the case of heat treatment via avoiding the above-mentioned range of CS and transport, tension, it is not preferred that roll wrinkles are generated, and support surface flatness is degraded. When heat treating in the line transport, provided are a transport method in which a film sheet is transported while holding the film sheet in a state of surface flatness, a transport method employing a pin or a clip, air transport method, a roller transport method, and so forth. Of these, air transport method and a roller transport method are preferably used, and a roller transport method is more preferably used.

A plastic film support is employed as a support in the present invention, but a composite material support in which plastic film sheets are appropriately laminated with metal plates (iron, stainless steel, aluminum, an the like, for example) or paper sheet material covered by polyethylene (referred to as composite material) can be used. This composite material may be laminated prior to or after forming a coated layer, and also right before mounting on a printing press.

[Subbing Layer]

It is preferred in the present invention that a subbing layer is formed between a plastic support and a hydrophilic layer. The subbing layer is preferably composed of two layers. It is preferable that material adhering to the plastic support is employed on the plastic support side (lower subbing layer), and material adhering to the hydrophilic layer is also used on the hydrophilic layer side.

Examples of the material employed as a lower subbing layer include vinyl polymer, polyester, styrene, or styrene-diolefin. Vinyl polymer and polyester are particularly preferable, or it is preferred that these are used in combination or in modification.

On the other hand, the material employed as an upper subbing layer preferably contains a water-soluble polymer in view of improved adhesion to the hydrophilic layer, and it is preferable that the water-soluble polymer, in which geratin or a polyvinyl alcohol unit is a major component, is specifically used. It is preferable that these are mixed with the material used as a lower subbing layer and the above-mentioned water-soluble polymer in view of adhesion to the lower subbing layer as well as to the hydrophilic layer.

It is a feature that a water-soluble polymer, in which a polyvinyl alcohol unit is a major component, is contained in a hydrophilic layer, and adhesion between the plastic support and the hydrophilic layer can be improved by containing a water-soluble polymer, in which a polyvinyl alcohol unit is a major component, in a lower subbing layer, whereby printing plate material exhibiting excellent on-press development and printing durability can also be obtained.

Next, each material which is usable for subbing layers will be explained.

(Polyester)

A substantively linear polyester resin obtained via a polycondensation reaction of either polybasic acid or its ester, and either polyol or its ester, is used as polyester. Further in the case of being used in the water-soluble form, employed is polyester into which an example of a component having a hydrophilic group including a sulfonate-containing component, a diethylene glycol component, a polyalkylene ether glycol component, or a polyether dicarboxylic acid component is introduced as a copolymerization component. Sulfonate-containing dicarboxylic acid (dicarboxylic acid is hereinafter referred to as polybasic acid) is preferably employed as a component having a hydrophilic group.

Examples employed as a polyester polybasic acid component include terephthalic acid, isophthalic acid, phthalic acid, phthalic anhydride, 2,6-naphthalene dicarboxylic acid, 1,4-cyclohexane dicarboxylic acid, adipic acid, sebacic acid, trimellitic acid, pyromellitic acid, dimer acid, maleic acid, fumaric acid, itaconic acid, p-hydroxybenzoic acid, and p-(β-hydroxy ethoxy) benzoic acid. A component having sulfonic-acid alkaline metal salt is preferably used as the above sulfonate-containing dicarboxylic acid. Alkaline metal salt of 4-sulfoisophthalic acid, 5-sulfoisophthalic acid, sulfoterephthalic acid, 4-sulfophthalic acid, 4-sulfonaphthalene-2,7-dicarboxylic acid, and 5-(4-sulfophenoxy) isophthalic acid are provided as examples. Of these, 5-sulfoisophthalic acid sodium salt is especially preferred. It is preferred from the aspect of water solubility and water resistance that the content of the dicarboxylic acid having a sulfonate is 5-15 mol %, based on the total dicarboxylic acid component, but is more preferably 6-10 mol %. A major dicarboxylic acid component having terephthalic acid and isophthalic acid is preferably used as water-soluble polyester, and it is further especially preferred, from the aspect of coatability and water solubility of a polyester support, that the content ratio of terephthalic acid and isophthalic acid is 30/70-70/30 in mol %. The content of these terephthalic acid and isophthalic acid components is preferably 50%-80 mol %, based on the total dicarboxylic acid component, and it is further preferred that an alicyclic dicarboxylic acid is employed as a polymerization component. Examples provided as the alicycle dicarboxylic acid include 1,4-cyclohexane dicarboxylic acid, 1,3-cyclohexane dicarboxylic acid, 1,2-cyclohexane dicarboxylic acid, 1,3-cyclopentane dicarboxylic acid, and 4,4'-bicyclo hexyl dicarboxylic acid. Dicarboxylic acid other than the above dicarboxylic acids can also be used as a copolymerization component for the water-soluble polyester of the present invention containing terephthalic acid and isophthalic acid as the dicarboxylic acid component. Examples provided as the dicarboxylic acid include aromatic dicarboxylic acid and straight-chained aliphatic dicarboxylic acid. The aromatic dicarboxylic acid is preferably used in the range of not more than 30 mol %, based on the total dicarboxylic acid component. Examples provided as the aromatic dicarboxylic acid include phthalic acid, 2,5-dimethyl terephthalic acid, 2,6-naphthalene dicarboxylic acid, 1,4-naphthalene dicarboxylic acid, and biphenyl dicarboxylic acid. Straight-chained aliphatic dicarboxylic acid is preferably used in the range of not more than 15 mol %, based on the total dicarboxylic acid component. Examples provided as the straight-chained aliphatic dicarboxylic acid include adipic acid, pimelic acid, suberic acid, azelaic acid, and sebacic acid.

Examples employed also as a polyol component include ethylene glycol, diethylene glycol, 1,4-butanediol, neopentylglycol, dipropylene glycol, 1,6-hexanediol, 1,4-cyclohexanedimethanol, xylylene glycol, trimethylolpropane, poly (ethylene oxide) glycol, and poly (tetramethylene oxide) glycol.

Ethylene glycol, in the range not less than 50 mol %, is preferably used as a glycol component of the water-soluble polyester, based on the total glycol component.

Polyester can be synthesized, employing either dicarboxylic acid or its ester, and either glycol or its ester, as the starting raw material, for which various methods can be employed to synthesize it. An initial condensed material of dicarboxylic acid and glycol, for example, is formed by an ester exchange method or a direct esterification method, and further the polyester resin can be acquired by a commonly known manufacturing method via melt-polymerization of the initial condensation material. As more specific examples, provided are methods such as a method of conducting a polycondensation process under high vacuum by decreasing pressure gradually after ester exchange reaction is conducted with ester of dicarboxylic acid which is, for example, dimethylester of dicarboxylic acid, and glycol, whereby methanol is distilled, a method of conducting a polycondensation process under high vacuum by gradually decreasing pressure after esterification reaction is conducted with dicarboxylic acid and glycol, whereby produced water is distilled, and also a method of conducting a polycondensation process under high vacuum after conducting esterification reaction by adding dicarboxylic acid. A commonly known catalyst can be employed as an ester exchange catalyst or a polycondensation catalyst. Examples used as the ester exchange catalyst include manganese acetate, calcium acetate, and zinc acetate. Examples used as the polycondensation catalyst include antimony trioxide, germanium oxide, dibutyltin oxide, and titanium tetrabutoxide. Various conditions of processes and components including polymerization and catalyst, however, are not limited to the above examples.

Provided as vinyl polymer in the present invention, for example, are acryl-containing monomers such as alkyl acrylate or alkyl methacrylate (the alkyl group such as methyl group, ethyl group, n-propyl group, isopropyl group, n-butyl group, isobutyl, t-butyl group, 2-ethylhexyl group, cyclohexyl group, phenyl group, benzyl group, or phenylethyl group); hydroxy group-containing monomers such as 2-hydroxyethyl acrylate, 2-hydroxyethyl methacrylate, 2-hydroxypropyl acrylate, or 2-hydroxypropyl methacrylate; amide group-containing monomer such as acrylamide, methacrylamide, N-methyl methacrylamide, N-methyl acrylamide, N-methylol acrylamide, N-methylol methacrylamide, N,N-dimethylol acrylamide, N-methoxymethyl acrylamide, N-methoxymethyl methacrylamide, or N-phenyl acrylamide;

amino group-containing monomers such as N,N-diethylaminoethyl acrylate, or N,N-diethyl aminoethyl methacrylate; epoxy group-containing monomers such as glycidyl acrylate, or glycidyl methacrylate; and carboxyl group or its salt-containing monomer such as acrylic acid, methacrylic acid, or its salt (such as sodium salt, potassium salt, or ammonium salt). As monomers other than acryl-containing monomers, provided, for example, are epoxy group-containing monomers such as allyl glycidyl ether, and others; sulfonic acid group or its salt-containing monomers such as styrene sulfonic acid, vinyl sulfonic acid, and its salt (such as sodium salt, potassium salt, or ammonium salt); carboxyl group or its salt-containing monomers such as crotonic acid, itaconic acid, maleic acid, fumaric acid, and its salt (such as sodium salt, potassium salt, or ammonium salt); acid anhydride-containing monomer such as maleic anhydride, or itaconic acid anhydride; vinyl isocyanate; allyl isocyanate; styrene; vinyltris alkoxy silane; alkyl maleic acid monoester; alkyl fumaric acid monoester; acrylonirile; methacrylonitrile; alkyl itaconic acid monoester; vinylidene chloride; vinyl acetate; and vinyl chloride. Epoxy group-containing monomers such as glycidyl acrylate, and glycidyl methacrylate are preferably used as a vinyl system monomer from the aspect of coated layer strength.

The vinyl polymer in the present invention is preferably polymer latex in view of environmental considerations. The polymer latex refers to a polymer component which is dispersed in water or a water-soluble medium as water-insoluble hydrophobic polymer minute particles. Each of dispersion states may be any of the following states: the polymer is emulsified in a dispersion medium in a dispersed state; the polymer is formed employing emulsion polymerization; the polymer is subjected to micelle dispersion; or the polymer has a partial hydrophilic structure in the molecule, and the molecular chain itself is subjected to molecular dispersion. Incidentally, examples of polymer latexes in the present invention are described in "Gosei Jushi Emulsion (Synthetic Resin Emulsion)", edited by Taira Okuda and Hiroshi Inagaki, published by Kobunshi Kankokai (1978); "Gosei Latex no Oyo (Application of Synthetic Latexes)", edited by Takaaki Sugimura, Yasuo Kataoka, Soichi Suzuki, and Keiji Kasahara, published by Kobunshi Kankokai (1993); and "Gosei Latex no Kagaku (Chemistry of Synthetic Latexes)", edited by Soichi Murol, published by Kobunshi Kankokai (1970).

The average particle size of polymer latex dispersing particles is 1-50000 nm, and more preferably 5-1000 nm. The particle size distribution thereof may be a polydispersed or a monodispersed distribution.

The vinyl polymer latexes of the present invention may be those having a uniform structure or may be core/shell type polymer latexes. In this case, the core and shell tend to be preferably used when glass transition temperature (Tg) varies.

The minimum film forming temperature (MFT) of the vinyl polymer latexes in the present invention is preferably −30° C. to 90° C., and more preferably 0° C. to 70° C. A film forming aid may be added to control the MFT. The film forming aid is also called a plasticizer, which is an organic compound (conventionally, an organic solvent) capable of lowering the MFT of a polymer latex, and is described in "Chemistry of Synthetic Latex" (Soichi Muroi, published by KOBUNSHI-KANKOKAI, 1970).

(Polymer Having Vinyl Alcohol Unit)

The polymer having vinyl alcohol unit, employed for a subbing layer, will be explained.

In the present invention, provided as the polymer having vinyl alcohol unit are polyvinyl alcohol and its derivative such as ethylene copolymerized polyvinyl alcohol, modified polyvinyl alcohol dissolved in water via partial butyral treatment, and so forth.

Polyvinyl alcohol preferably has a polymerization degree of not less than 100 and a saponification degree of not less than 60, and as its derivative, polymer having a monomer unit exemplarily represents vinyl compounds such as ethylene propylene and the like as a copolymerization component of vinyl acetate before saponification, acrylic acid esters (for example, t-butylacrylate, phenylacrylate, 2-naphthylacrylate, etc.), methacrylic acid esters (for example, methylmethacrylate, ethylmethacrylate, 2-hydroxyethylmethacrylate, benzylmethacrylate, 2-hydroxypropylmethacrylate, phenylmethacrylate, cyclohexylmethacrylate, cresylmethacrylate, 4-chlorobenzylmethacrylate, ethyleneglycoldimethacrylate, etc.), acrylamides (for example, acrylamide, methylacrylamide, ethylacrylamide, propylacrylamide, butylacrylamide, tert-butylacrylamide, cyclohexylacrylamide, benzylacrylamide, hydroxymethylacrylamide, methoxyethylacrylamide, dimethylaminoethylacrylamide, phenylacrylamide, dimethylacrylamide, diethylacrylamide, β-cyanoethylacrylamide, diacetoneacrylamide, etc.), methacrylamides (for example, methacrylamide, methylmethacrylamide, ethylmethacrylamide, propylmethacrylamide, butylmethacrylamide, tert-butylmethacrylamide, cyclohexylmethacrylamide, benzylmethacrylamide, hydroxymethylmethacrylamide, methoxyethylmethacrylamide, dimethylaminoethylmethacrylamide, phenylmethacrylamide, dimethylmethacrylamide, diethylmethacrylamide, β-cyanoethylmethacrylamide, etc.), styrenes (for example, styrene, methylstyrene, dimethylstyrene, trimethylstyrene, ethylstyrene, isopropylstyrene, methoxystyrene, acetoxystyrene, chlorostyrene, dichlorostyrene, bromostyrene, vinylbenzoic acid methyl ester, etc.), divinylbenzene, acrylonitrile, methacrylonitrile, N-vinylpyrrolidone, N-vinyloxazolidone, vinylidene chloride, phenylvinylketone, etc. Of these, ethylene copolymerized polyvinyl alcohol is preferably employed. The content of polymer containing a polyvinyl alcohol unit in an upper subbing layer is 1-50% by weight, based on the total binder of the upper subbing layer, and preferably 5-30% by weight. In the case of less than 1%, no effect is observed, and In the case of not less than 50%, it is not preferable to result in enhanced hydrophilicity and to exhibit degraded printing durability at high humidity.

(Others)

The following inorganic particles can be employed for the subbing layer in the present invention. Examples of the inorganic material include silica, alumina, barium sulfate, calcium carbonate, titania, tin oxide, indium oxide, and talk. These particle shapes are not particularly limited, and any shape such as needle-like, spherical, plate-like, or fracture-like shape can be used. The particle diameter is preferably 0.1-10 μm, more preferably 0.2-6 μm, and still more preferable 0.3-3 μm. The addition amount of particles is 0.1-50 mg per 1 $m^2$ of one surface, preferably 0.2-30 mg, and more preferably 0.3-20 mg.

In the present invention, thickness of the subbing layer is preferably 0.05-0.50 μm in view of transparency and uneven coating (interference unevenness), and more preferably 0.10-0.30 μm.

As for the subbing layer, the coating liquid is coated onto either one surface or both surfaces of polyester film particularly before completing crystalline orientation during coating of a support, but it is preferable that the coating liquid is coated onto either one surface or both surfaces of polyester film in on line or off line after coating of a support.

As a coating method of the subbing layer, commonly known as appropriate coating-methods may be employed. It is preferable to apply the following method singly or in combination, for example, a kiss coating method, reverse coating method, die coating method, reverse kiss coating method, offset gravure coating method, the Meyer bar coating method, roller brush method, spray coating method, air-knife coating method, dip-coating method, and curtain coating method.

It is preferable to provide an antistatic layer for the subbing layer. The antistatic layer is made of an antistatic agent and a binder.

A metal oxide is preferably employed as an antistatic agent. Examples of such metal oxides preferably include ZnO, $TiO_2$, $SnO_2$, $Al_2O_3$, $In_2O_3$, $SiO_2$, MgO, BaO, $MoO_2$, and $V_2O_5$, as well as their multiple oxides. Specifically, from the viewpoint of miscibility with a binder, electrical conductivity and transparency, $SnO_2$ (being tin oxide) is preferred. As examples containing a different atom, Sb, Nb, or a halogen atom may be added to $SnO_2$. The added amount of the different atom is preferably in the range of 0.01-25 mol %, but the range of 0.1-15 mol % is specifically preferred.

Tin oxide is preferably in the form of an amorphous sol or crystalline particles. In the case of a water based coating, an amorphous sol is preferred, and in the case of a solvent based coating, it is in the form of crystalline particles. Specifically, from the viewpoint of ecology and handling during operation, the amorphous sol form of a water based coating is preferred.

A production method of the amorphous $SnO_2$ sol utilized for the present invention may be either of the following methods, a method to prepare by dispersing $SnO_2$ particles into an appropriate solvent, or a method to prepare via decomposition reaction of a solvent-soluble Sn compound in a solvent. The preparation via a decomposition reaction of a solvent-soluble Sn compound in the solvent will be described. The solvent-soluble compound means a compound containing an oxoanion such as $K_2SnO_3.3H_2O$, water-soluble halide compound such as $SnCl_4$ or a compound having a structure represented by $R'_2SnR_2$, $R_3SnX$ or $R_2SnX_2$ including, for example, organometallic compound such as $(CH_3)_3SnCl.$(pyridine), $(C_4H_9)_2Sn(O_2CC_2H_5)_2$ and an oxo-salt such as $Sn(SO_4)_2.2H_2O$. Methods for preparing a $SnO_2$ sol using the solvent-soluble Sn compound include a physical method by dissolving in a solvent, followed by applying heat or pressure, chemical method by oxidation, reduction or hydrolysis, and a method of preparing a $SnO_2$ sol via an intermediate. A $SnO_2$ sol preparation method described in Japanese Patent Examined Publication No. 35-6616 will be described as an example. $SnCl_4$ is first dissolved in distilled water of 100 times in capacity, and a precipitate of $Sn(OH)_4$ is prepared as an intermediate. Ammonia water is added into this product so as to be mildly alkaline, and colloidal $SnO_2$ sol can be prepared subsequently by heating up until ammonia odor does not smell at all. In addition, provided can be various solvents used for Sn compounds including an alcohol solvent such as methanol, ethanol, or isopropanol, an ether solvent such as tetrahydrofuran, dioxane, or diethylether, an aliphatic organic solvent such as hexane or heptane, and an aromatic organic solvent such as benzene or pyridine, though water is employed as a solvent in the example. The present invention is not limited to solvents, but solvents of water and alcohols are preferably selected.

On the other hand, crystalline particles are described in detail in Japanese Patent O.P.I. Publication Nos. 56-143430 and 60-258541. Production methods of these electrically conductive metal oxide particles may be any one of the following methods or a combination of them. The first method is one in which metal oxide particles are prepared by baking, after which the particles are heat treated under the presence of different kinds of atoms; the second is that different kinds of atoms are presented during preparation of metal oxide particles while baking; and the third being oxygen defect is introduced by a decrease of oxygen concentration during baking.

The average particle diameter of the primary particles employed in the present invention is 0.001-0.5 μm, but preferably 0.001-0.2 μm. The solid content coverage of the metal oxide employed in this invention is 0.05-2 g, but preferably 0.1-1 g. Further, the volume fraction of metal oxide in the antistatic layer of this invention is 8-40% by volume, but preferably 10-35% by volume. The above range may vary due to color, form and composition of metal oxide particles, but in view of transparency and electrical conductivity, the above range is preferred.

Preferable examples of binder also include polyester, acryl modified polyester, polyurethane, acryl resin, vinyl resin, vinylidene chloride resin, polyethylene imine vinylidene resin, polyethylene imine, polyvinyl alcohol, modified polyvinyl alcohol, cellulose ester and gelatin.

EXAMPLE

Next, the present invention will be explained employing examples, but the present invention is not limited thereto.

Example 1

(Preparation of Support)

(Pet Resin)

Added to 100 parts by weight of dimethyl terephthalate, and 65 parts by weight of ethylene glycol, was 0.05 parts by weight of magnesium acetate anhydrate as an ester exchange catalyst, and an ester exchange reaction was conducted under commonly known practice. To the obtained product, added were 0.05 parts by weight of antimony trioxide and 0.03 parts by weight of trimethyl phosphate ester. Subsequently, subjected to a gradual temperature rise and pressure reduction, polymerization was conducted at 280° C. and 66.6 Pa, to obtain polyethylene terephthalate (PET) resin having an intrinsic viscosity of 0.70.

Employing the PET resin as obtained above, biaxial oriented PET film was prepared as described below.

(Biaxial Oriented Pet Film)

Pelletized PET resin was subjected to vacuum drying at 150° C. for 8 hours, after which the resin was melt-extruded at 285° C. in layers from a T die, and the layers were stuck together on a 30° C. cooling drum while electrostatically impressed, and cooled to solidification, to obtain unoriented film. This unoriented film was stretched at a factor of 3.3 times in the longitudinal direction, employing a roll type longitudinal stretching machine. After this, a uniaxial oriented film was obtained, and using a tenter type transverse stretching machine, the film was subsequently stretched at a ratio of 50% to the total transverse stretch ratio at 90° C. in the first stretching zone, after which the resulting film was further stretched to a factor of 3.3 of the total transverse stretch ratio at 100° C. in the second stretching zone. Further, preheat treatment was conducted at 70° C. for two seconds, after which heat setting was conducted at 150° C. for five seconds in the first setting zone, and then at 220° C. for 15 seconds in the second setting zone. Subsequently, to the transverse (width) direction, 5% relaxation treatment was conducted at 160° C., and after the film was released from the tenter, the film was cooled to room temperature over 60 sec. Further, the film was released from clips, and slit and wound up respectively, to obtain a 175 μm thick biaxial oriented PET film. The Tg of this biaxially oriented PET film was 79° C. In addition, a thickness distribution of the resulting support was 2%.

The surface of an image formation layer of the biaxially oriented PET film was subjected to corona discharge treatment at 8 $W/m^2$·min and further thereon, subbing layer coating solution a-1 was coated so as to have a dry layer thickness of 0.8 μm and dried at 123° C. to form subbing layer A-1 on the side of the hydrophilic layer.

The surface on the other side was also subjected to corona discharge treatment at 8 $W/m^2$·min and further thereon, subbing layer coating solution b-1 was coated as a subbing layer of the backing layer so as to have a dry layer thickness of 0.1 μm and dried at 123° C. to form subbing layer B-1 having an anti-static function.

After this, the upper surfaces of subbing layers A-1 and A-2 were subjected to corona discharge treatment at 8 $W/m^2$·min, subbing layer coating solution a-2 was coated onto subbing layer A-1 so as to have a dry layer thickness of 0.1 μm and dried at 123° C. to form subbing layer A-2, and subbing layer coating solution b-2 was coated onto subbing layer B-1 so as to have a dry layer thickness of 0.2 μm and dried at 123° C. to form subbing layer B-2. Further, after heat-treating at 140° C. for two minutes, a sample in which a subbing layer was formed was prepared.

| | |
|---|---|
| (Subbing layer coating solution a-1) | |
| Latex of styrene/glycidyl methacrylate/butyl acrylate (60/39/1) copolymer (Tg = 75° C.) 30% (in terms of solid content) | 250 g |
| Latex of styrene/glycidyl methacrylate/butyl acrylate (20/40/40) copolymer (Tg = 20° C.) 30% (in terms of solid content) | 25 g |
| Anionic surfactant S-1 (2% by weight) | 30 g |
| Water was added to make 1 kg. | |
| (Subbing layer coating solution b-1) | |
| Metal oxide F-1 (8.3% by weight of $SnO_2$ contained) | 109.5 g |
| Latex of styrene/butyl acrylate/hydroxymethacrylate (27/45/28) copolymer (Tg = 45° C.) 30% (in terms of solid content) | 3.8 g |
| Latex of styrene/glycidyl methacrylate/butyl acrylate (20/40/40) copolymer (Tg = 20° C.) 30% (in terms of solid content) | 15 g |
| Anionic surfactant S-1 (2% by weight) | 25 g |
| Distilled water was added to make 1 kg. | |
| (Subbing layer coating solution a-2) | |
| Modified water-soluble polyester L-4 solution (23% by weight) | 31 g |
| Aqueous solution (5% by weight) of EXCEVAL (polyvinyl alcohol/ethylene copolymer) RS-2117, produced by Kuraray Co., Ltd. | 58 g |
| Anionic surfactant S-1 (2% by weight) | 6 g |
| Hardener H-1 (0.5% by weight) | 100 g |
| Spherical silica matting agent SEAHOSTAR KE-P50 (produced by Nippon Shokubai Co., Ltd.) 2% dispersion | 10 g |
| Distilled water was added to make 1000 ml. | |
| (Subbing layer coating solution b-2) | |
| Modified water-soluble polyester L-3 solution (18% by weight) | 150 g |
| Anionic surfactant S-1 (2% by weight) | 6 g |
| Hardener H-1 (0.5% by weight) | 100 g |
| Spherical silica matting agent SEAHOSTAR KE-P50 (produced by Nippon Shokubai Co., Ltd.) 2% dispersion | 10 g |
| Distilled water was added to make 1000 ml. | |

(Preparation of Water-Soluble Polyester)

A mixture consisting of 35.4 parts by weight of dimethyl terephthalate, 33.63 parts by weight of dimethyl isophthalate, 17.92 parts by weight of sodium salt of dimethyl 5-sulfoisophthalate, 62 parts by weight of ethylene glycol, 0.065 part by weight of calcium acetate monohydrate, and 0.022 part by weight of manganese acetate tetrahydrate underwent transesterification at 170-220° C. under a flow of nitrogen while distilling out methanol. Thereafter, 0.04 part by weight of trimethyl phosphate, 0.04 part by weight of antimony trioxide, and 6.8 parts by weight of 4-cyclohexanedicarboxylic acid were added. The resulting mixture underwent esterification at a reaction temperature of 220-235° C. while distilling out a nearly theoretical amount of water. Thereafter, the reaction system was subjected to pressure reduction and heating over a period of one hour and was subjected to polycondensation at a final temperature of 280° C. and a maximum pressure of 133 Pa for one hour, whereby water-soluble Polyester A-1 was prepared. The intrinsic viscosity of the resulting water-soluble polyester A-1 was 0.33.

Subsequently, 850 ml of pure water was placed in a 2-liter three-necked flask fitted with stirring blades, a refluxing cooling pipe, and a thermometer, and while rotating the stirring blades, 150 g of water-soluble polyester A-1 was gradually added. The resulting mixture was stirred at room temperature for 30 minutes without any modification. Thereafter, the interior temperature was raised to 98° C. over a period of 1.5 hours and at that resulting temperature, dissolution was performed. Thereafter, the temperature was lowered to room temperature over a period of one hour and the resulting product was allowed to stand overnight, whereby a water-soluble polyester solution of 15% by weight was prepared.

(Preparation of Modified Polyester L-3 Solution)

Placed in a 3-liter four-necked flask fitted with stirring blades, a reflux cooling pipe, a thermometer, and a dripping funnel was 1,900 ml of the foregoing 15% by weight water-soluble polyester solution, and the interior temperature was raised to 80° C., while rotating the stirring blades. Into this added was 6.52 ml of a 24% aqueous ammonium peroxide solution, and a monomer mixed liquid composition (consisting of 35.7 g of ethyl acrylate and 35.7 g of methyl methacrylate) was dripped over a period of 30 minutes, and reaction was allowed for an additional 3 hours. Thereafter, the resulting product was cooled to at most 30° C., and filtrated, whereby modified water-soluble polyester L-3 solution at a solid content of 18% by weight was obtained.

(Preparation of Water-Soluble Polyester)

A mixture consisting of 35.4 parts by weight of dimethyl terephthalate, 33.63 parts by weight of dimethyl isophthalate, 17.92 parts by weight of sodium salt of dimethyl 5-sulfoisophthalate, 62 parts by weight of ethylene glycol, 0.065 part by weight of calcium acetate monohydrate, and 0.022 part by weight of manganese acetate tetrahydrate underwent transesterification at 170-220° C. under a flow of nitrogen while distilling out methanol. Thereafter, 0.04 part by weight of trimethyl phosphate, 0.04 part by weight of antimony trioxide, and 6.8 parts by weight of 4-cyclohexanedicarboxylic acid were added. The resulting mixture underwent esterification at a reaction temperature of 220-235° C. while distilling out a nearly theoretical amount of water.

Thereafter, the reaction system was subjected to pressure reduction and heating over a period of one hour and was subjected to polycondensation at a final temperature of 280° C. and a maximum pressure of 133 Pa for one hour, whereby water-soluble Polyester was prepared. The intrinsic viscosity of the resulting water-soluble polyester was 0.33 (100 ml/g), and Mw was 80,000-100,000.

Subsequently, 850 ml of pure water was placed in a 2-liter three-necked flask fitted with stirring blades, a refluxing cooling pipe, and a thermometer, and while rotating the stirring blades, 150 g of water-soluble polyester was gradually added. The resulting mixture was stirred at room temperature for 30 minutes without any modification. Thereafter, the interior temperature was raised to 98° C. over a period of 1.5 hours and at that resulting temperature, dissolution was performed. Thereafter, the temperature was lowered to room temperature over a period of one hour and the resulting product was allowed to stand overnight, whereby a water-soluble polyester solution of 15% by weight was prepared.

Placed in a 3-liter four-necked flask fitted with stirring blades, a reflux cooling pipe, a thermometer, and a dripping funnel was 1,900 ml of the foregoing 15% by weight water-soluble polyester A-1 solution, and the interior temperature was raised to 80° C. while rotating the stirring blades. Into this added was 6.52 ml of a 24% aqueous ammonium peroxide solution, and a monomer mixed liquid composition (consisting of 28.5 g of glycidyl methacrylate, 21.4 g of ethyl acrylate, and 21.4 g of methyl methacrylate) was dripped over a period of 30 minutes, and reaction was allowed for an additional 3 hours. Thereafter, the resulting product was cooled to at most 30° C., and filtrated, whereby modified water-soluble polyester B-1 solution (vinyl based component modification ratio of 20% by weight) at a solid content of 18% by weight was prepared. Vinyl based component modification ratio of 5% by weight was also set to prepare modified water-soluble polyester L-4 solution.

S-1

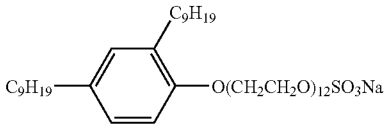

H-1

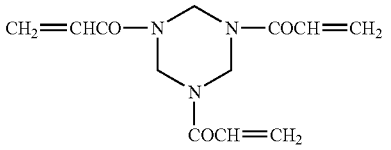

<<Back Coating Layer>>

(Preparation of Back Coating Layer Coating Solution)

A back coating solution was prepared via filtration after the following composition was mixed while stirring employing a homogenizer.

TABLE 1

| Materials | Addition amount |
|---|---|
| Colloidal silica: Snowtex-XS (solid content of 20% by weight, produced by Nissan Kagaku Co., Ltd.) | 33.60 g |
| Acryl emulsion: DK-05 (solid content of 48% by weight, produced by GifuCerac Co., Ltd. | 14.00 g |
| Matting agent (PMMA average particle diameter of 5.5 μm) | 0.56 g |
| Pure water | 51.84 g |
| Solid content (% by weight) | 14% by weight |

(Coating of Back Coating Layer)

The above back coating layer coating solution was coated onto a subbed layer sample on the side of subbing layer surface B of the above-mentioned support employing a wire bar #6, and allowed to pass through a 100° C. drying zone with a length of 15 m at a transportation speed of 15 m/minute to obtain a back coating layer with a coating amount of 2.0 $g/m^2$.

<<Lower and Upper Hydrophilic Layers>>

(Preparation of Lower Hydrophilic Layer Coating Solution)

A lower hydrophilic layer coating solution was prepared via filtration after the following composition was mixed while stirring employing a homogenizer.

TABLE 2

Lower hydrophilic layer coating solution

| Materials | Solid content (%) | Amount in g per 1 kg |
|---|---|---|
| Porous metal oxide: Silton JC-40 | 100 | 24.4 |
| Layer structural clay mineral Montmorillonite: Mineral Colloid MO gel (porous aluminosilicate particles having an average particle diameter of 4 μm, produced by Mizusawa Kagaku Co., Ltd.) prepared by vigorously stirring Montmorillonite Mineral Colloid MO in water with a homogenizer to give a solid content of 5% by weight | 5 | 48.0 |
| Cu—Fe—Mn type metal oxide black pigment: TM-3550 black aqueous dispersion (prepared by dispersing TM-3550 black powder having a particle diameter of about 0.1 μm produced by Dainichi Seika Kogyo Co., Ltd. in water to give a solid content of 40% by weight (including 0.2% by weight of dispersant) | 40 | 109.8 |
| Carboxymethyl cellulose (Reagent produced by Kanto Kagaku Co., Ltd.) | 4 | 32.7 |
| Phosphate•dodecahydrate solution (Reagent produced by Kanto Kagaku Co., Ltd.) | 10 | 6.5 |
| Colloidal silica: Snowtex-XS (solid content of 20% by weight, produced by Nissan Kagaku Co., Ltd.) | 20.00 | 375.8 |
| Colloidal silica: Snowtex-ZL (solid content of 20% by weight, produced by Nissan Kagaku Co., Ltd.) | 40.00 | 12.0 |
| Particle type and amount shown in FIG. 5 | (100.00) | |
| Silicon surfactant: FZ2161 (Nippon Unicar Co., Ltd.) | 20.00 | 17.6 |
| Pure water (residual amount) | | |
| Total weight (g) | | 1000.0 g |

(Preparation of Upper Hydrophilic Layer Coating Solution)

An upper hydrophilic layer coating solution was prepared via filtration after the following composition was mixed while stirring employing a homogenizer.

TABLE 3

Upper hydrophilic layer coating solution

| Materials | Solid content (%) | Amount in g per 1 kg |
|---|---|---|
| Cu—Fe—Mn type metal oxide black pigment: TM-3550 black aqueous dispersion (prepared by dispersing TM-3550 black powder having a particle diameter of about 0.1 μm produced by Dainichi Seika Kogyo | 40 | 26.9 |

TABLE 3-continued

| Upper hydrophilic layer coating solution | | |
|---|---|---|
| Materials | Solid content (%) | Amount in g per 1 kg |
| Co., Ltd. in water to give a solid content of 40% by weight (including 0.2% by weight of dispersant) | | |
| Carboxymethyl cellulose (Reagent produced by Kanto Kagaku Co., Ltd.) | 4 | 29.9 |
| Phosphate•dodecahydrate solution (Reagent produced by Kanto Kagaku Co., Ltd.) | 10 | 5.7 |
| Colloidal silica: Snowtex-XS (solid content of 30% by weight, produced by Nissan Kagaku Co., Ltd.) | 30.00 | 52.0 |
| Colloidal silica: Snowtex-PSM (solid content of 20% by weight, produced by Nissan Kagaku Co., Ltd.) | 20.00 | 117.0 |
| Layer structural clay mineral Montmorillonite: Mineral Colloid MO gel (porous aluminosilicate particles having an average particle diameter of 4 μm, produced by Mizusawa Kagaku Co., Ltd.) prepared by vigorously stirring Montmorillonite Mineral Colloid MO in water with a homogenizer to give a solid content of 5% by weight | 5 | 47.9 |
| Porous metal oxide particles: Silton AMT-08 (0.8 μm in average particle diameter, produced by Mizusawa Kagaku Co., Ltd.) | 100.0 | 24.0 |
| Colloidal silica: MP4540M (solid content of 40% by weight, produced by Nissan Kagaku Co., Ltd.) | 40.00 | 36.0 |
| Porous metal oxide: Silton JC-20 | 100 | 12.0 |
| Pure water | | 648.6 |
| Total weight (g) | | 1000.0 g |

(Coating of Lower and Upper Hydrophilic Layers)

A lower hydrophilic layer coating solution was coated onto the subbing layer surface of a PET support with one-side subbing layer employing a wire bar, and allowed to pass through a 100° C. drying zone with a length of 15 m at a transportation speed of 15 m/minute so as to obtain a coating amount of 3.0 g/$m^2$ after drying. Subsequently, an upper hydrophilic layer coating solution was coated employing a wire bar, and allowed to pass through a 100° C. drying zone with a length of 30 m at a transportation speed of 15 m/minute so as to obtain a coating amount of 3.0 g/$m^2$ after drying. The aging treatment of the sample was conducted at 60° C. for 2 days after coating.

(Image Formation Layer)

An image formation layer coating solution described in Table 4 was coated onto the above-mentioned upper hydrophilic layer employing a wire bar #5, and allowed to pass through a 70° C. drying zone with a length of 30 m at a transportation speed of 15 m/minute to form an image formation layer used for a planographic printing material. A coating amount of the image formation layer was 0.5 g/$m^2$. The aging treatment of the sample was also conducted at 50° C. for 2 days after coating.

TABLE 4

| Image formation layer coating solution | | |
|---|---|---|
| Materials | Solid content (%) | Amount in g per 1 kg |
| Carnauba wax emulsion: A118 having a solid content of 40% by weight (the wax having an average particle diameter of 0.3 μm and a melting point of 80° C., produced by GifuCerac Co., Ltd.) | 40 | 138.7 |
| microcrystalline wax emulsion: A206 having an average particle diameter of 0.5 μm (a solid content of 40% by weight, produced by GifuCerac Co., Ltd.) | 40 | 50.0 |
| Wax shown in Table 5 | 40 | 37.5 |
| Penon JE-66 (a solid content of 10% by weight, produced by Nippon Starch Chemical Co., Ltd.) | 10 | 20.0 |
| Sodium polyacrylate: 10 times diluted solution of DL522 (molecular weight of 170,000 and solid content 30%, produced by Nippon Shokubai Co., Ltd.) | 3 | 250.0 |
| IPA (Isopropyl alcohol) | | 15.0 |
| Pure water (residual amount) | | |
| Total weight (g) | | 1000.0 g |

The above-mentioned planographic printing plate material was cut into a width of 660 mm, and wound 30 mm around a paper core having an outer diameter of 76 mm to prepare planographic printing plate material samples 1-17 in the form of roll.

[Evaluation Method]

Exposure Method

The resulting printing plate sample was cut so as to suit an exposure device, wound around an exposure drum of the exposure device and imagewise exposed. Exposure was carried out employing an infrared laser having a wavelength of 830 nm and a laser beam spot diameter of 18 μm at a resolution of 2,400 dpi with exposure energy of 240 mJ/$cm^2$ to form an image with a screen number of 175 lines (The term, "dpi" shows the number of dots per 2.54 cm.), and an exposed printing plate sample with an image was obtained.

Printing Method

DAIYA 1-F produced by Mitsubishi Jukogyo Co., Ltd. was used as a printing press. Printing was carried out employing dampening water; 2% by weight of Astromark 3 (produced by Nikken Kagaku Kenkyusho), and ink (Toyo Hyunity Magenta, produced by Toyo Ink Manufacturing Co.) to conduct the printing evaluation. Printing for other than printing durability evaluation was carried out employing coated paper sheets. At the time of printing tables, a spraying process was conducted in powder scale 10 employing a powder (product name: Nikkalyco M, produced by Nikka Ltd.) printing press.

(On-Press Development: Evaluation at Starting Stage of Printing)

At the starting stage of printing, the number of printed copies consumed until a printed paper sheet having an excellent S/N ratio (exhibiting no background contamination at non-image portions, which means that non-image portions on an image formation layer are removed on the press, and density at image portions are in an appropriate range, and also no developing trouble generated by scratches on the image formation layer caused by the matte material of a back coating layer) was obtained, was measured, and it was designated as an indicator of on-press development. The less the number is, the better the on-press development.

(Scratch Resistance: Printing Durability at Non-Image Portion)

The material was rubbed by using the nail portion of an index finger, and the actual damage level of 20$^{th}$ printed paper sheet was examined introducing rankings, and this was designated as an indicator of scratch resistance. B: No ink adhesion, BC: Slight ink adhesion, C: some ink adhesion, CD: ink adhesion with the same amount of density as at 50% dot portions, and D: ink adhesion with the same amount of density as at solid portions.

(Printing Durability)

Printing durability terminates at the stage where either lack of 3% small dots in an image or lowered density at solid portions is confirmed. The number of paper sheets was obtained at this stage.

(Exposure Image Visualization)

The above-mentioned formed images were determined at exposed and unexposed portions employing a densitometer, exposure image visualization was evaluated according to the following criterion. A: 1.2-2.0, B: 0.8-1.2, C: 0.5-0.8. and D: less than 0.5.

(Background Contamination Resistance)

The color difference between the non-image line portion of a print and a white paper sheet was measured after printing 10000 copies employing a color checker SPM-100 produced by Gretag Macbeth Company, and this was designated as an indictor of background contamination resistance. A practical problem is caused when the color difference (ΔE) is 0.5 or more.

The results are shown in Table 6. It is to be understood that a planographic printing plate material of the present invention exhibits excellent properties of on-press development, printing durability, exposure image visualization, background contamination resistance, and scratch resistance.

TABLE 6

| Sample No. | *1 | Contamination ΔE | *2 | *3 | Scratch resistance ranking |
|---|---|---|---|---|---|
| 1 | 12 | 0.25 | D: 0.25 | 18000 | D |
| 2 | 24 | 0.93 | C: 0.45 | 14000 | D |
| 3 | 32 | 0.85 | C: 0.36 | 6000 | D |
| 4 | 34 | 1.02 | C: 0.60 | 21000 | C |
| 5 | 20 | 0.96 | C: 0.48 | 8000 | D |
| 6 | 18 | 0.34 | C: 0.57 | 22000 | CD |
| 7 | 12 | 0.45 | A: 1.13 | 53000 | B |
| 8 | 11 | 0.37 | A: 1.19 | 63000 | B |
| 9 | 13 | 0.36 | A: 1.33 | 61000 | B |
| 10 | 18 | 0.25 | A: 1.03 | 58000 | BC |
| 11 | 10 | 0.42 | A: 1.26 | 65000 | B |
| 12 | 22 | 0 | C: 0.62 | 15000 | D |
| 13 | 10 | 1.62 | A: 1.26 | 71000 | B |
| 14 | 13 | 0.29 | A: 1.33 | 59000 | BC |
| 15 | 16 | 0.39 | B: 0.95 | 29000 | CD |
| 16 | 34 | 1.12 | C: 0.85 | 28000 | C |
| 17 | 12 | 0.32 | B: 1.11 | 51000 | BC |

*1: On-press development (Number of paper sheets)
*2: Exposure image visualization ranking
*3: Printing durability (Number of paper sheets)
A-118: Carnauba wax emulsion having a melting point of 80° C. and a melt viscosity of 8 mPa · s
A-206: Microcrystalline wax emulsion having a melting point of 108° C. and a melt viscosity of 8 mPa · s A-514: Polyethylene wax emulsion (LDPE) having a melting point of 113° C. and a melt viscosity of 1000 mPa·s AB-50: Polyethylene wax emulsion (HDPE) having a melting point of 125° C. and a melt viscosity of 1300 mPa·s AC-35: Polypropylene wax emulsion having a melting point of 143° C. and a melt viscosity of 100 mPa·s As for spherical silica particle types (The CV values in Table 5 indicate CV values of the following spherical silica particles. The content ratio in Table 5 also indicates a content ratio of spherical silica particles by volume having a particle

TABLE 5

| Sample | | Image formation layer Wax | Lower hydrophilic layer | | | | | |
|---|---|---|---|---|---|---|---|---|
| No. | Remarks | types | *1 | *2 | *3 | *4 | *5 | *4 |
| 1 | Comp. | — | — | — | — | — | — | — |
| 2 | Comp. | AB-50 | — | — | — | — | — | — |
| 3 | Comp. | AC-35 | — | — | — | — | — | — |
| 4 | Comp. | AC-35 | A (6 μm) | 94 | 2 | 21 | — | — |
| 5 | Comp. | AC-35 | — | 0 | — | — | a | 4 |
| 6 | Comp. | A-514 | — | — | — | — | — | — |
| 7 | Example | A-514 | A (6 μm) | 94 | 2 | 21 | — | — |
| 8 | Example | A-514 | A (6 μm) | 78 | 2 | 21 | a | 4 |
| 9 | Example | A-514 | A (6 μm) + b (6 μm) | 75 | 6 | 23 (21 + 2) | a | 4 |
| 10 | Example | A-514 | D (5 μm) | 78 | 2 | 21 | a | 4 |
| 11 | Example | A-514 | E (7 μm) | 78 | 2 | 21 | a | 4 |
| 12 | Comp. | A-514 | F (4 μm) | 6 | 2 | 21 | a | 4 |
| 13 | Comp. | A-514 | G (8 μm) | 5 | 2 | 21 | a | 4 |
| 14 | Example | A-514 | A (6 μm) | 66 | 2 | 18 | a | 7 |
| 15 | Comp. | A-514 | A (6 μm) | 42 | 2 | 12 | a | 13 |
| 16 | Comp. | AB-50 | A (6 μm) | 94 | 2 | 21 | — | — |
| 17 | Example | A-514 | A (6 μm) + b (6 μm) | 70 | 10 | 23 (15 + 8) | a | 4 |

*1: Spherical silica particle types
*2: Content ratio (% by volume)
*3: CV value (%)
*4: Content (% by weight)
*5: Other particle types
Comp.: Comparative example diameter of 5.0-7.0 μm, based on the total volume of particles having a particle diameter of 2-10 μm contained in the hydrophilic layer.), A: (HIPRESICA FQ of a particle diameter of 6 μm, produced by Ube Nitto Kasei), D: (HIPRESICA FQ of a particle diameter of 5 μm, produced by Ube Nitto Kasei), E: (HIPRESICA FQ of a particle diameter of 7 μm, produced by Ube Nitto Kasei), F: (HIPRESICA FQ of a particle diameter of 4 μm, produced by Ube Nitto Kasei), G: (HIPRESICA FQ of a particle diameter of 8 μm, produced by Ube Nitto Kasei).

As for other particle types, symbol a represents silica-coating melamine particles OPTBEADS 3500S having a particle diameter of 3.5 μm and a CV value of 15% (produced by Nissan Chemical Industries, Ltd.), and symbol b represents silica particles SUNSPHERE H-51 having a particle diameter of 5.5 μm and a CV value of 60% (produced by Donkai Chemical Industries Co., Ltd.). The content in Table 5 represents a content (by weight), based on the total content of the lower hydrophilic layer.

[Effect of the Invention]

A planographic printing plate material and a printing method, in which excellent properties of on-press development, exposure image visualization, scratch resistance, background contamination resistance, and printing durability are exhibited, can be provided in the present invention.

What is claimed is:

1. A planographic printing plate material in the form of a roll comprising a plastic support, and provided thereon, an image formation layer, a hydrophilic layer and an antistatic layer comprising an antistatic agent as a subbing layer, wherein the image formation layer contains polyolefin wax having a melting point of 105-120° C. and a melt viscosity of 1-1200 mPa·s, the hydrophilic layer contains spherical silica particles having a particle diameter of 5.0-7.0 μm, and a content ratio of the spherical silica particles having a particle diameter of 5.0-7.0 μm is not less than 60% by volume, based on a total volume of particles having a particle diameter of 2-10 μm contained in the hydrophilic layer, wherein the antistatic layer is formed between the plastic support and the hydrophilic layer.

2. The planographic printing plate material of claim 1, wherein a CV value (variation coefficient) in a particle diameter distribution of spherical silica particles having a particle diameter of 5.0-7.0 μm is 10% or less.

3. The planographic printing plate material of claim 1, wherein the hydrophilic layer is composed of an upper hydrophilic layer and a lower hydrophilic layer, and the lower hydrophilic layer contains spherical silica particles having a particle diameter of 5.0-7.0 μm.

4. The planographic printing plate material of claim 3, wherein the lower hydrophilic layer further contains spherical silica particles having a particle diameter of 3.0-4.0 μm.

5. The planographic printing plate material of claim 1, wherein a number average molecular weight of the polyolefin wax is 500-5000.

6. The planographic printing plate material of claim 1, wherein the hydrophilic layer contains a light-to-heat conversion material.

7. The planographic printing plate material of claim 1, wherein the image formation layer is an on-press developable layer.

8. A printing method, wherein a developing process by supplying dampening water or dampening water and printing ink on a planographic printing press, and printing are conducted after forming images on the planographic printing plate material of claim 1, employing a thermal head or an infrared laser.

* * * * *